United States Patent
Yamazaki et al.

(10) Patent No.: US 6,849,482 B2
(45) Date of Patent: Feb. 1, 2005

(54) SEMICONDUCTOR DEVICE, AND METHOD OF FORMING THE SAME

(75) Inventors: Shunpei Yamazaki, Tokyo (JP); Koichiro Tanaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/303,649

(22) Filed: Nov. 25, 2002

(65) Prior Publication Data

US 2003/0109085 A1 Jun. 12, 2003

Related U.S. Application Data

(62) Division of application No. 09/500,125, filed on Feb. 8, 2000, now Pat. No. 6,506,635.

(30) Foreign Application Priority Data

Feb. 12, 1999 (JP) ............................................. 11-034513

(51) Int. Cl.[7] ............................................. H01L 21/339
(52) U.S. Cl. ...................................... 438/148; 438/308
(58) Field of Search ................................ 438/148, 150, 438/161, 163, 185, 187, 198, 301, 308, 981

(56) References Cited

U.S. PATENT DOCUMENTS

| | | | |
|---|---|---|---|
| 4,599,133 A | 7/1986 | Miyao et al. | |
| 5,432,122 A | 7/1995 | Chae | |
| 5,569,610 A | 10/1996 | Zhang et al. | |
| 5,614,733 A | 3/1997 | Zhang et al. | |
| 5,643,826 A | 7/1997 | Ohtani et al. | ................. 437/88 |
| 5,648,277 A | 7/1997 | Zhang et al. | ................. 437/21 |
| 5,648,662 A | 7/1997 | Zhang et al. | |
| 5,696,011 A | 12/1997 | Yamazaki et al. | |
| 5,756,364 A | 5/1998 | Tanaka et al. | |
| 5,764,320 A | * 6/1998 | Konuma et al. | |
| 5,783,468 A | 7/1998 | Zhang et al. | |
| 5,803,965 A | 9/1998 | Yoon | |
| 5,811,328 A | 9/1998 | Zhang et al. | |
| 5,821,137 A | 10/1998 | Wakai et al. | ................. 438/163 |
| 5,858,822 A | 1/1999 | Yamazaki et al. | ............ 438/166 |
| 5,923,962 A | 7/1999 | Ohtani et al. | ................. 438/150 |
| 5,943,593 A | 8/1999 | Noguchi et al. | ............. 438/487 |
| 5,946,561 A | 8/1999 | Yamazaki et al. | ............ 438/166 |

(List continued on next page.)

FOREIGN PATENT DOCUMENTS

| | | |
|---|---|---|
| JP | 63-223788 | 9/1988 |
| JP | 1-045162 | 2/1989 |
| JP | 4-124813 | 4/1992 |
| JP | 7-130652 | 5/1995 |

OTHER PUBLICATIONS

English abstract re Japanese patent application No. JP 62-223788, published Sep. 19, 1988.

(List continued on next page.)

*Primary Examiner*—Phuc T. Dang
(74) *Attorney, Agent, or Firm*—Cook, Alex, McFarron, Manzo, Cummings & Mehler, Ltd.

(57) ABSTRACT

In order to realize a semiconductor device of enhanced TFT characteristics, a semiconductor thin film is selectively irradiated with a laser beam at the step of crystallizing the semiconductor thin film by the irradiation with the laser beam. By way of example, only driver regions (103 in FIG. 1) are irradiated with the laser beam in a method of fabricating a display device of active matrix type. Thus, it is permitted to obtain the display device (such as liquid crystal display device or EL display device) of high reliability as comprises the driver regions (103) made of crystalline semiconductor films, and a pixel region (102) made of an amorphous semiconductor film.

86 Claims, 15 Drawing Sheets

U.S. PATENT DOCUMENTS

| | | |
|---|---|---|
| 6,008,101 A | 12/1999 | Tanaka et al. |
| 6,013,542 A | 1/2000 | Yamazaki et al. .......... 438/132 |
| 6,080,643 A | 6/2000 | Noguchi et al. ............ 438/487 |
| 6,124,155 A | 9/2000 | Zhang et al. |
| 6,160,272 A | 12/2000 | Arai et al. |
| 6,166,399 A | 12/2000 | Zhang et al. |
| 6,242,289 B1 | 6/2001 | Nakajima et al. ........... 438/151 |
| 6,277,679 B1 | 8/2001 | Ohtani ....................... 438/151 |
| 6,335,213 B1 | 1/2002 | Zhang et al. |
| 6,494,162 B1 * | 12/2002 | Zhang et al. |

OTHER PUBLICATIONS

English abstract re Japanese patent application No. JP 1–045162, published Feb. 17, 1989.

English abstract re Japanese patent application No. JP 7–130652, published May 19, 1995.

* cited by examiner

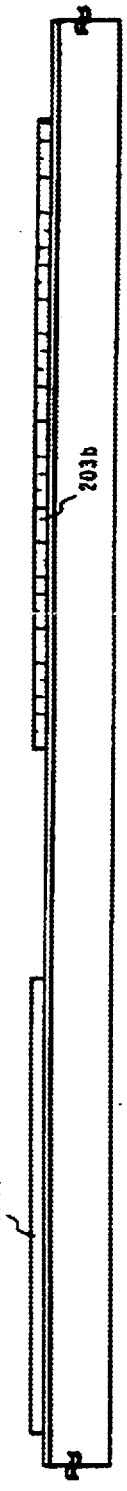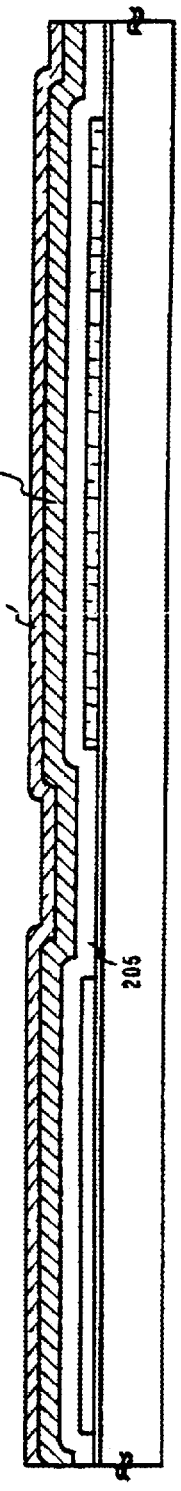
Fig.2(A) FORMING STEP OF BASE FILM 202 AND AMORPHOUS SEMICONDUCTOR FILM 204a
Fig.2(B) STEP OF SELECTIVELY CRYSTALLIZING AMORPHOUS SEMICONDUCTOR FILM
Fig.2(C) PATTERNING STEP
Fig.2(D) FORMING STEP OF INSULATING FILM 205 AND CONDUCTIVE LAYER
DRIVER CIRCUIT   WIRING PORTION   PIXEL UNIT

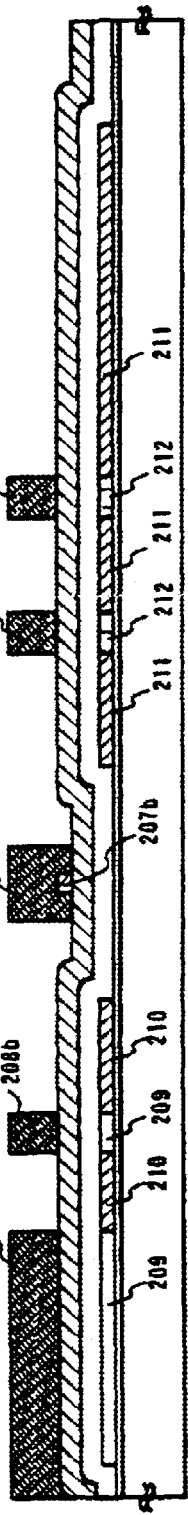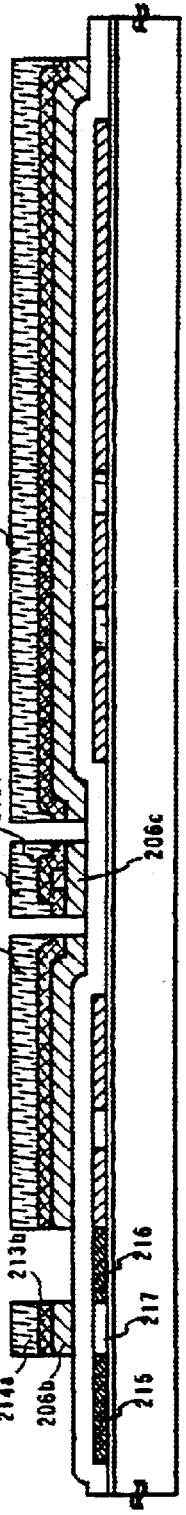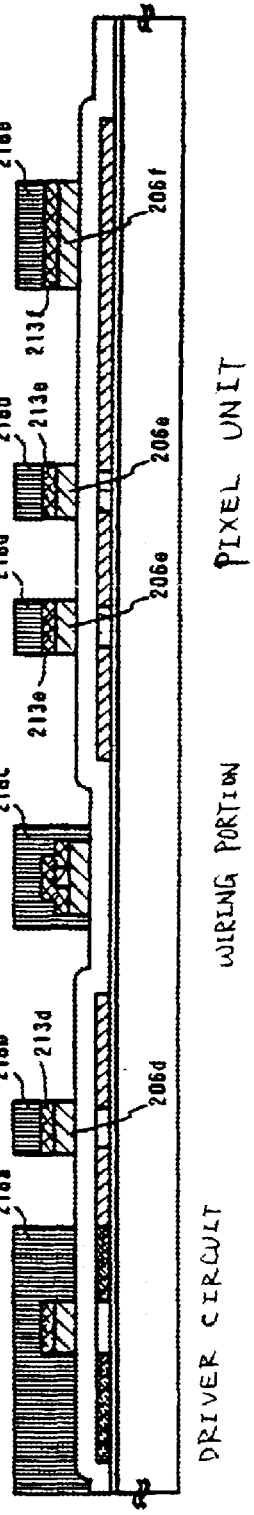

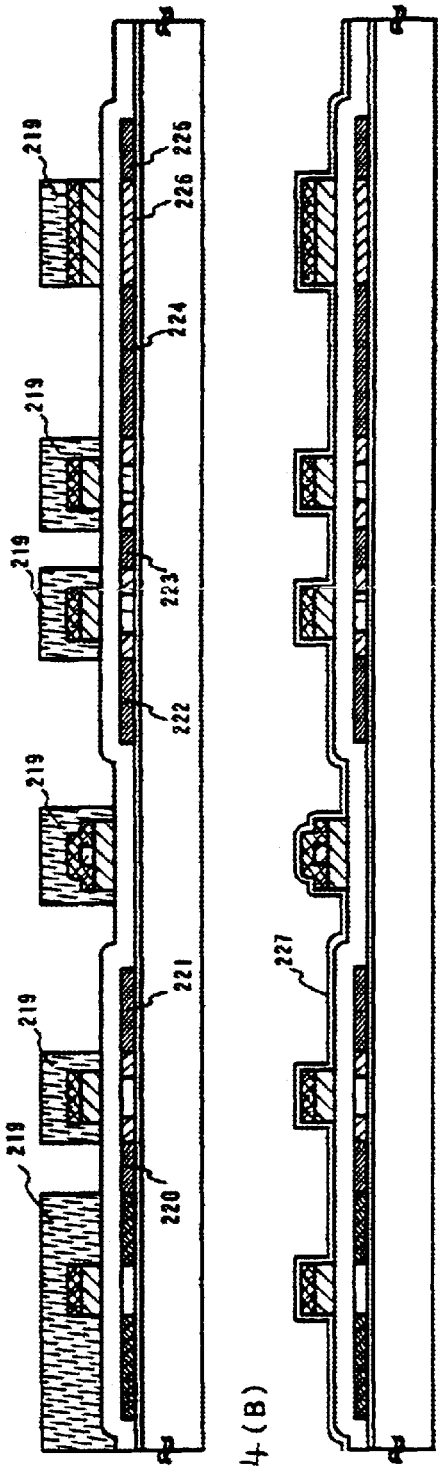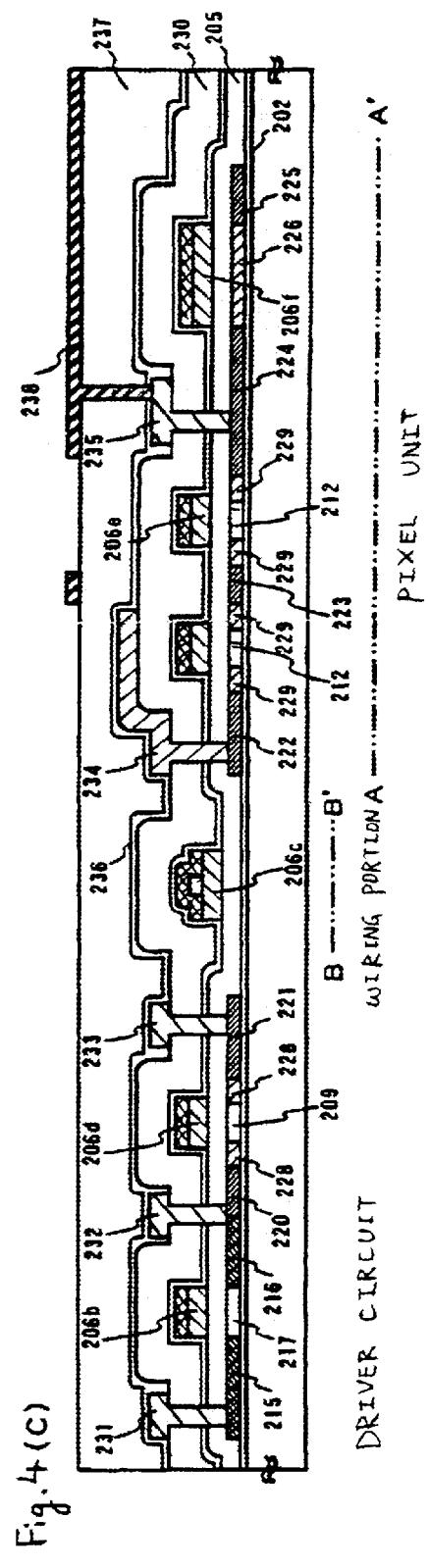

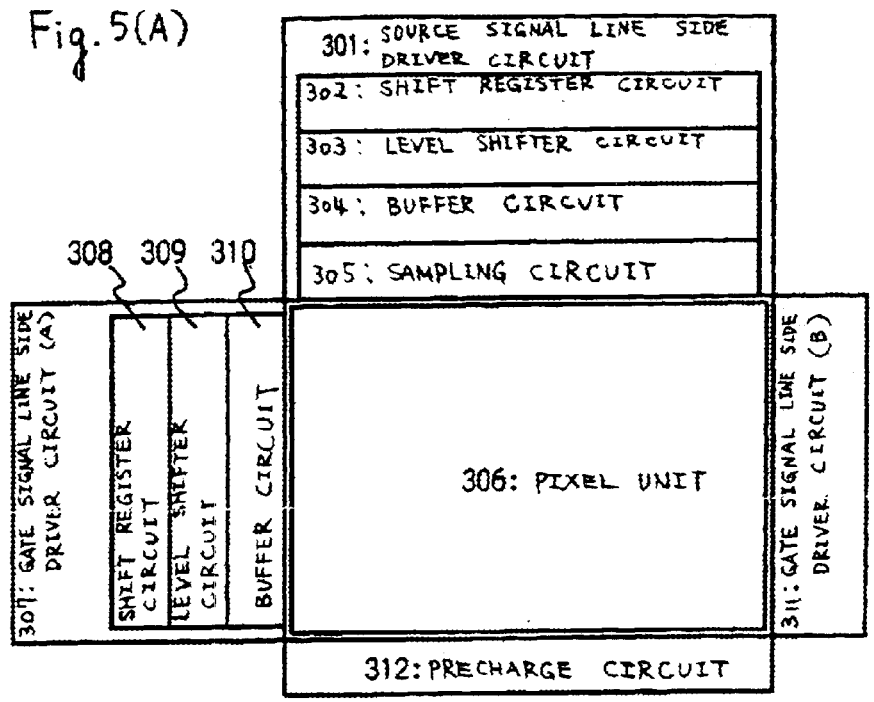
Fig. 5(A)
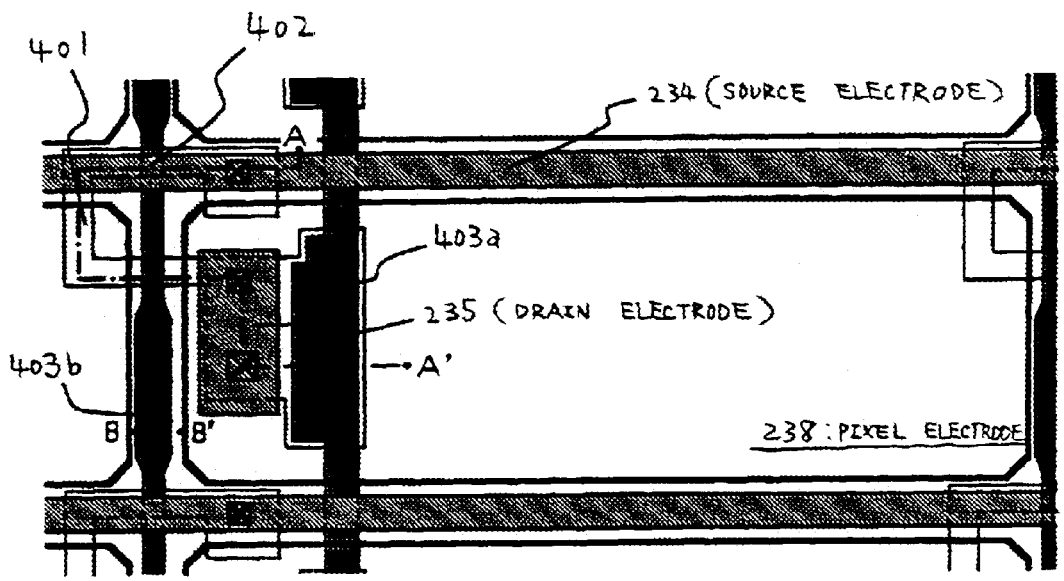
Fig. 5(B) TOP PLAN VIEW SHOWING PIXEL UNIT

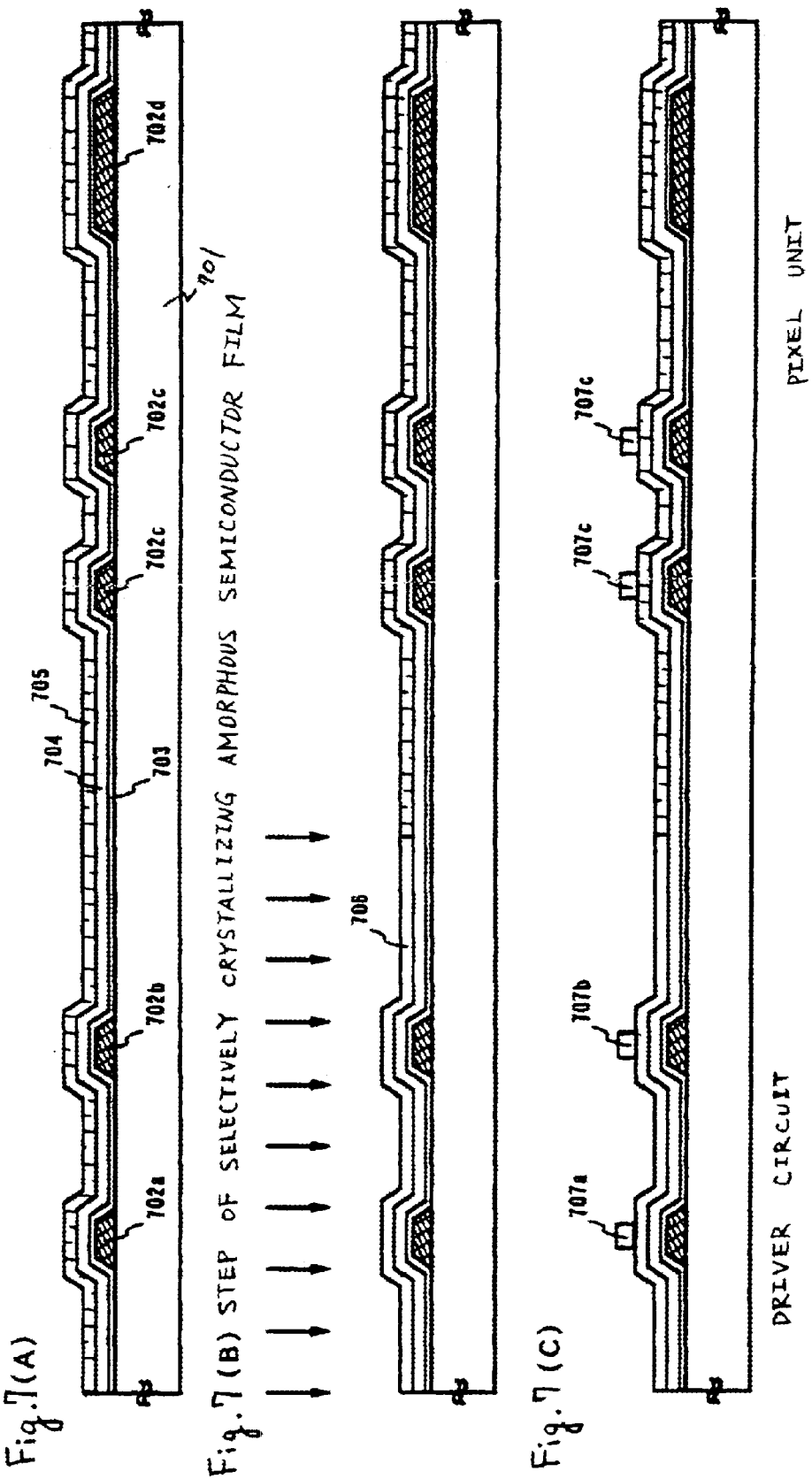

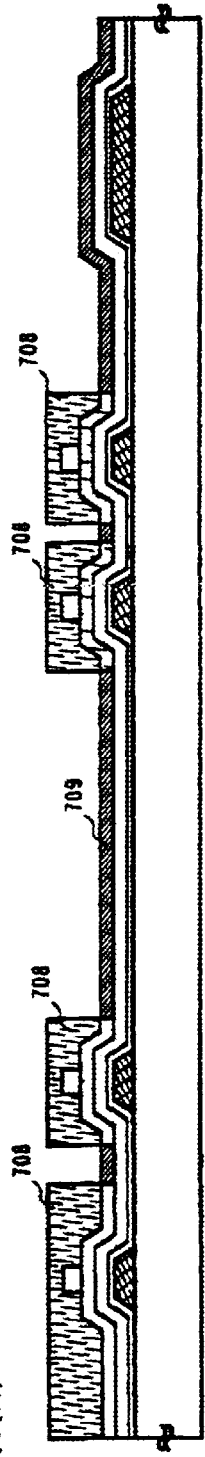
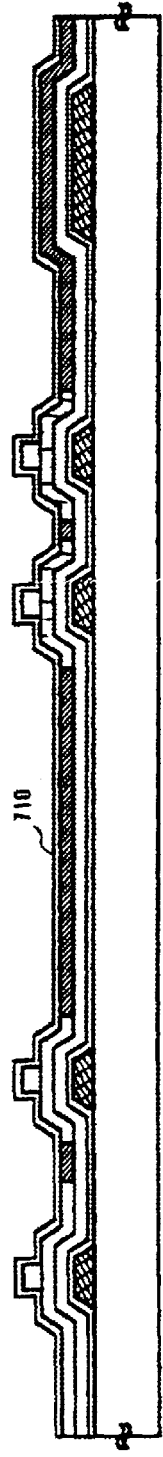
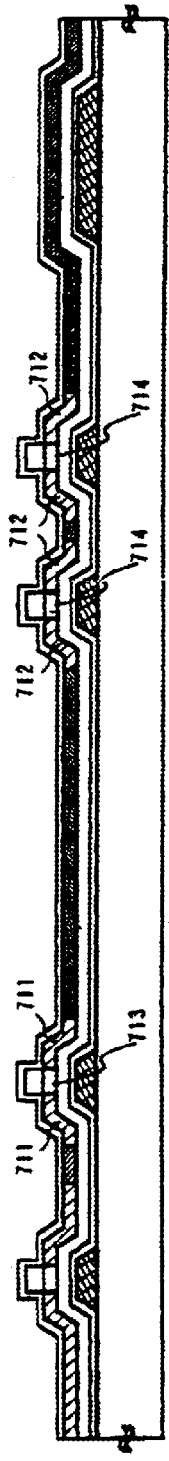
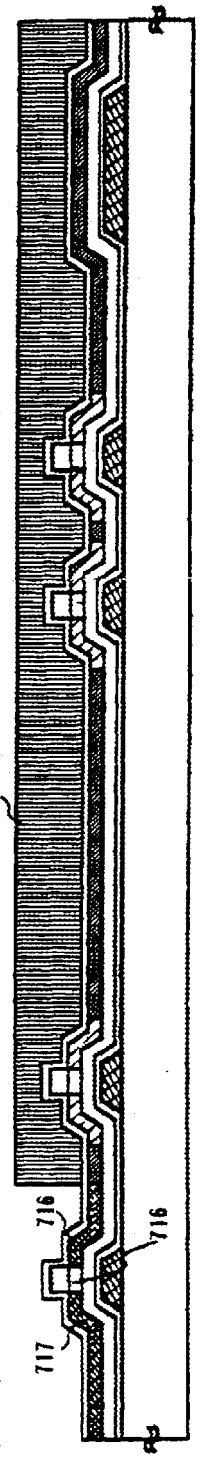
Fig.8(A) STEP OF DOPING IMPURITY (FORMING STEP OF n⁺ REGION)
Fig.8(B)
Fig.8(C) STEP OF DOPING IMPURITY (FORMING STEP OF n⁻ REGION)
Fig.8(D) STEP OF DOPING IMPURITY (FORMING STEP OF P REGION)

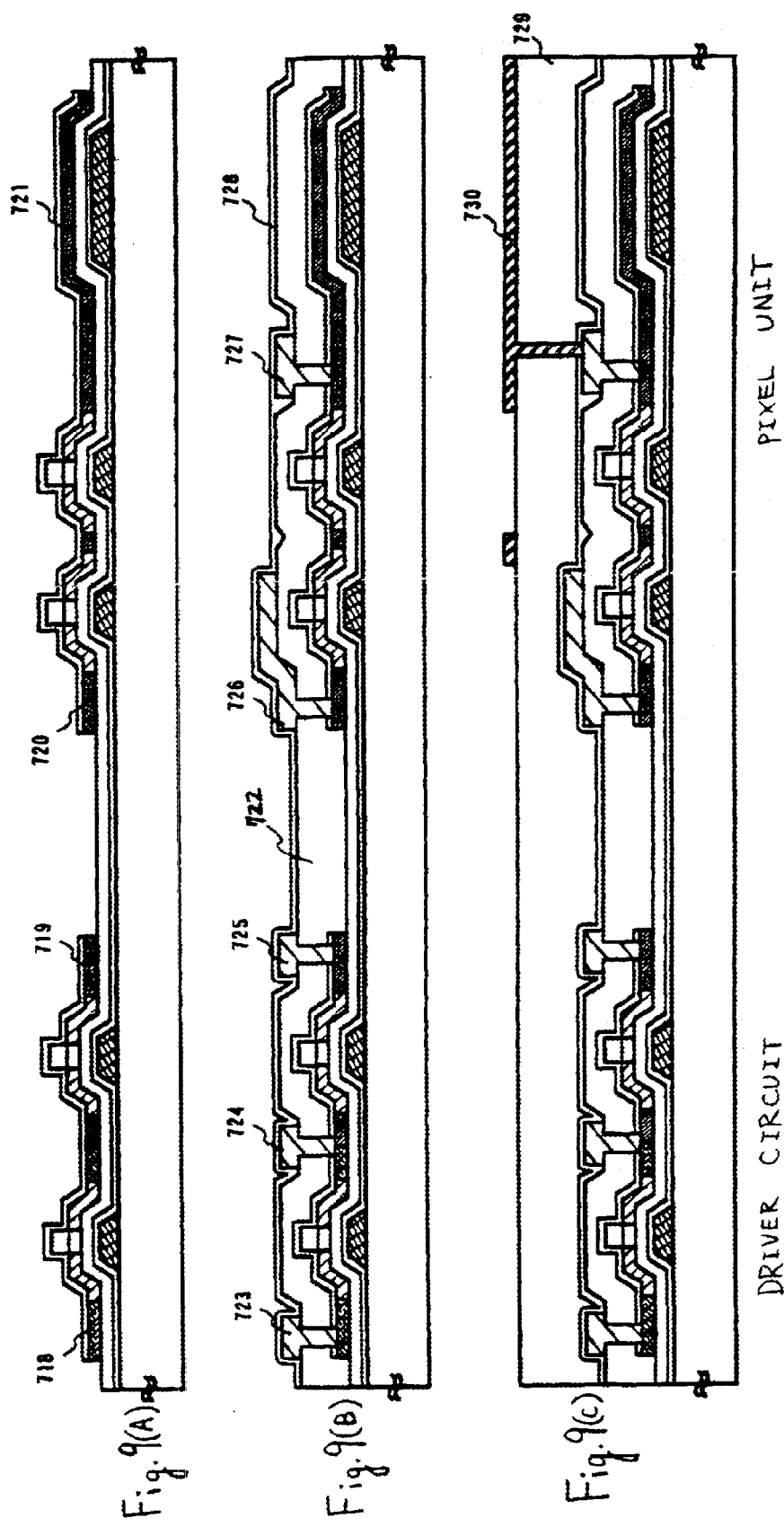

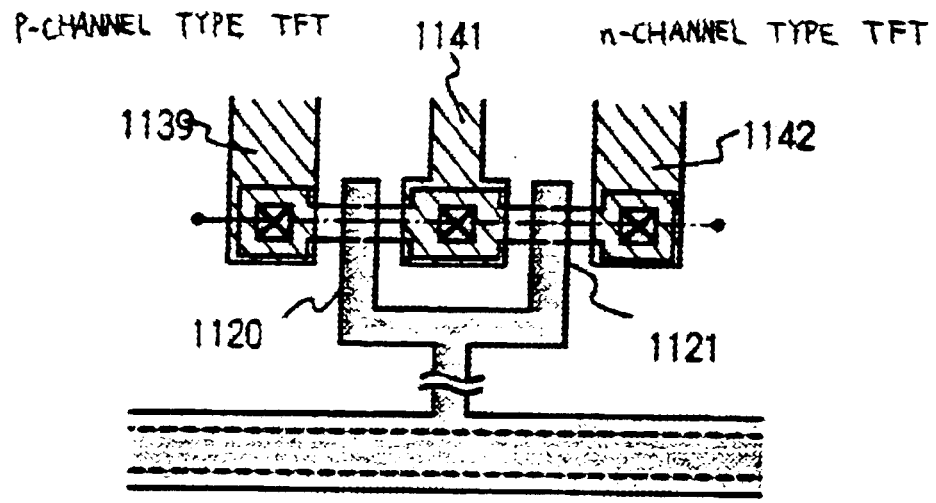
Fig. 10(A) TOP PLAN VIEW OF CMOS CIRCUIT
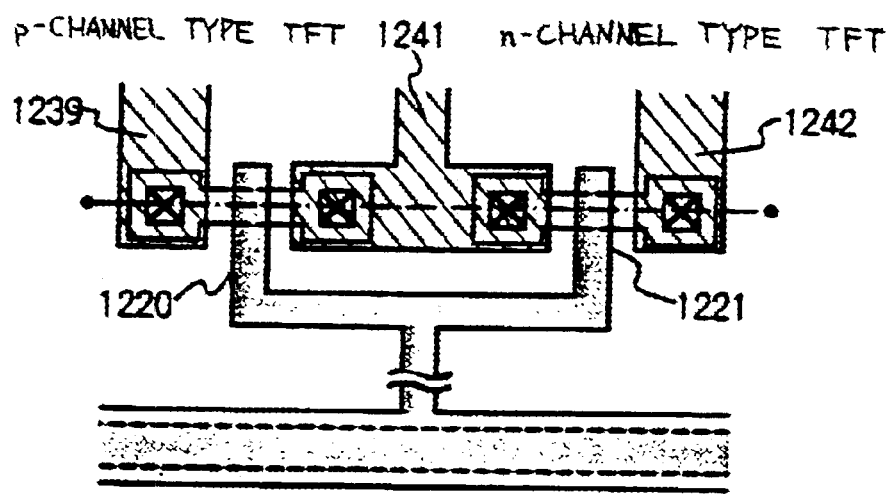
Fig. 10(B) TOP PLAN VIEW OF CMOS CIRCUIT

EL PANEL CIRCUIT DIAGRAM

SEMICONDUCTOR DEVICE, AND METHOD OF FORMING THE SAME

This is a divisional of copending U.S. application Ser. No. 09/500,125, filed on Feb. 8, 2000 now U.S. Pat. No. 6,506,635.

BACKGROUND OF THE INVENTION

1. Field of the Invention

The present invention relates to a semiconductor device having a circuit which is configured of thin film transistors (hereinbelow, often abbreviated to "TFT"). By way of example, it relates to the constructions of an electrooptic device which is typified by a liquid crystal display panel, and an electronic equipment in which such an electrooptic device is installed as a component.

Incidentally, here in this specification, the expression "semiconductor device" is intended to signify general devices which can function by utilizing semiconductor properties, and it shall cover all of electrooptic devices, semiconductor circuits and electronic equipment within its category.

2. Description of the Related Art

In recent years, notice has been taken of technology wherein thin film transistors (TFTs) are constructed using a semiconductor thin film (several to a few hundred [nm] thick) which is formed on a substrate having an insulating surface. The TFTs are extensively applied to ICs (integrated circuits) and electronic devices such as electrooptic devices, and it is especially hurried to develop them as the switching elements of an image display device.

In, for example, a liquid crystal display device, attempts have been made to apply TFTs to all sorts of electric circuits such as a pixel unit in which pixels arrayed in the shape of a matrix are individually controlled, a driver circuit which controls the pixel unit, and a logic circuit (including a processor circuit, a memory circuit, etc.) which processes data signals fed from outside.

Besides, there has been known a construction (system-on-panel) in which the above circuits (pixel unit, driver circuit, etc.) are packaged on a single substrate. In the pixel unit, the pixel plays the role of retaining information sent from the driver circuit. Herein, unless the OFF current of the TFT connected to the pixel is sufficiently small, the information cannot be retained, and a good display cannot be presented.

On the other hand, in the driver circuit, a high mobility is required of the TFTs. As the mobility is higher, the structure of this circuit can be simplified more, and the display device can be operated at a higher speed.

As stated above, the TFTs arranged in the driver circuit and those arranged in the pixel unit are different in the required properties. More specifically, the TFTs arranged in the pixel unit need not have a very high mobility, but their requisites are that the OFF current is small and that the value thereof is uniform throughout the pixel unit. In contrast, the TFTs of the driver circuit located around the pixel unit take preference of the mobility over the OFF current, and their requisite is that the mobility is high.

It has been difficult, however, to manufacture the TFTs of the preferential mobility and the TFTs of the small OFF current on an identical substrate at a high productivity and without spoiling their reliabilities, by employing a fabricating method in the prior art.

SUMMARY OF THE INVENTION

As understood from the foregoing, a quite new construction having hitherto been nonexistent is required in order to incarnate a system-on-panel which has a built-in logic circuit.

In compliance with such a requirement, the present invention has for its object to provide an electrooptic device represented by AM-LCD (Active-Matrix Liquid Crystal Display), the respective circuits of which are formed using TFTs of appropriate structures in accordance with their functions, and which is accordingly endowed with a high reliability.

The construction of the present invention disclosed in this specification consists in a semiconductor device having a driver circuit and a pixel unit which are formed on an identical substrate, characterized in:

that a channel forming region of at least one TFT (thin film transistor) included in said driver circuit is made of a crystalline semiconductor film; and that a channel forming region of a TFT included in said pixel unit is made of an amorphous semiconductor film.

Besides, in the above construction, the semiconductor device is characterized in that said channel forming region of said at least one TFT included in said driver circuit is formed via a processing step of irradiation with a laser beam or an intense light beam similar thereto.

Also, in the above construction, the semiconductor device is characterized in that the channel forming regions of said at least one TFT included in said driver circuit and said TFT included in said pixel unit are made of a semiconductor film which is formed by sputtering.

Further, in the above construction, the semiconductor device is characterized in that gate insulating films of said at least one TFT included in said driver circuit and said TFT included in said pixel unit are made of an insulating film which is formed by sputtering.

Still further, in the above construction, the semiconductor device is characterized in that said crystalline semiconductor film is of polysilicon, while said amorphous semiconductor film is of amorphous silicon.

Yet further, in the above construction, the semiconductor device is characterized by being a display device of active matrix type, for example, an EL (electroluminescent) display device or a liquid crystal display device.

In addition, the construction of the present invention for realizing the above structure consists in:

a method of fabricating a semiconductor device having a driver circuit and a pixel unit which are formed on an identical substrate, characterized by comprising:

the first step of forming an amorphous semiconductor film on an insulating surface of said substrate;

the second step of irradiating a selected part of said amorphous semiconductor film with either of a laser beam and an intense light beam similar thereto, thereby to turn the part of said amorphous semiconductor film into a crystalline semiconductor film;

the third step of patterning said crystalline semiconductor film, thereby to form a semiconductor layer of said driver circuit, and also patterning the resulting amorphous semiconductor film, thereby to form a semiconductor layer of said pixel unit;

the fourth step of forming an insulating film on the semiconductor layers; and the fifth step of forming gate electrodes on said insulating film.

Besides, in the above construction, the fabricating method is characterized in that said fourth step is implemented by sputtering.

Another construction of the present invention consists in:

a method of fabricating a semiconductor device having a driver circuit and a pixel unit which are formed on an identical substrate, characterized by comprising:

the first step of forming an amorphous semiconductor film on an insulating surface of said substrate;

the second step of forming an insulating film on said amorphous semiconductor film;

the third step of irradiating a selected part of said amorphous semiconductor film with either of a laser beam and an intense light beam similar thereto through said insulating film, thereby to turn the part of said amorphous semiconductor film into a crystalline semiconductor film;

the fourth step of patterning said crystalline semiconductor film, thereby to form a semiconductor layer of said driver circuit, and also patterning the resulting amorphous semiconductor film, thereby to form a semiconductor layer of said pixel unit; and the fifth step of forming gate electrodes on said insulating film.

Besides, in the above construction concerning the fabrication, the fabricating method is characterized in that said second step is implemented by sputtering.

Also, in each of the above constructions concerning the fabrication, the fabricating method is characterized in that said first step is implemented by sputtering.

Still another construction of the present invention consists in:

a method of fabricating a semiconductor device having a driver circuit and a pixel unit which are formed on an identical substrate, characterized by comprising:

the first step of forming gate electrodes on an insulating surface of said substrate;

the second step of forming an insulating film on said gate electrodes;

the third step of forming an amorphous semiconductor film on said insulating film;

the fourth step of irradiating a selected part of said amorphous semiconductor film with either of a laser beam and an intense light beam similar thereto, thereby to turn the part of said amorphous semiconductor film into a crystalline semiconductor film; and the fifth step of patterning said crystalline semiconductor film, thereby to form a semiconductor layer of said driver circuit, and also patterning the resulting amorphous semiconductor film, thereby to form a semiconductor layer of said pixel unit.

Besides, in each of the constructions concerning the fabrication, the fabricating method is characterized by comprising after said fifth step:

the sixth step of doping selected regions to become source and drain regions, with elements which belong to the 15th Group and 13th Group of elements; and the seventh step of activating said elements which belong to said 15th Group and 13th Group, and with which the semiconductor layers have been doped.

Also, in each of the constructions concerning the fabrication, the fabricating method is characterized in that said semiconductor device is a liquid crystal display device.

Further, in each of the constructions concerning the fabrication, the fabricating method is characterized by comprising after said seventh step of activating said elements:

the eighth step of forming an interlayer insulating film over the active layers;

the ninth step of forming a pixel electrode on said interlayer insulating film;

the tenth step of forming an EL layer on said pixel electrode; and the eleventh step of forming either of a cathode and an anode on said EL layer.

Still further, in each of the above constructions concerning the fabrication, the fabricating method is characterized in that said semiconductor device is an EL display device.

BRIEF DESCRIPTION OF THE DRAWINGS

FIGS. 2(A) thru 2(D) are sectional views showing the steps of a process for fabricating an AM-LCD (active-matrix liquid crystal display);

FIGS. 3(A) thru 3(D) are sectional views showing the steps of the process for fabricating the AM-LCD;

FIGS. 4(A) thru 4(C) are sectional views showing the steps of the process for fabricating the AM-LCD;

FIGS. 5(A) and 5(B) are a block diagram showing the circuit arrangement of the AM-LCD, and a top plan view showing a pixel unit in the AM-LCD, respectively;

FIGS. 7(A) thru 7(C) are sectional views showing the steps of a process for fabricating an AM-LCD;

FIGS. 8(A) thru 8(D) are sectional views showing the steps of the process for fabricating the AM-LCD;

FIGS. 9(A) thru 9(C) are sectional views showing the steps of the process for fabricating the AM-LCD;

FIGS. 10(A) and 10(B) are top plan views each showing a CMOS (complementary metal-oxide-semiconductor transistor) circuit;

DETAILED DESCRIPTION OF THE INVENTION

The aspects of performance of the present invention will be described below. It features the present invention that an amorphous semiconductor film and a crystalline semiconductor film are separately employed as the active layers of the TFTs of those circuits of an electrooptic device, represented by AM-LCD (Active-Matrix Liquid Crystal Display) or EL (electroluminescent) display device, which are formed on an identical substrate, in accordance with the functions of the circuits. By way of example, in the electrooptic device represented by the AM-LCD or the EL display device, it is the feature of the present invention that the amorphous semiconductor film (such as amorphous silicon film) is used as the active layers of the TFTs arranged in a pixel unit, whereas the crystalline semiconductor film (such as polysilicon film or polycrystalline silicon film) is utilized as the active layers of the TFTs arranged in an electric circuit required to be capable of operating at high speed, such as driver circuit or logic circuit.

For the purpose of incarnating the above construction, the amorphous semiconductor film needs to be selectively crystallized into the crystalline semiconductor film on the identical substrate. Such a method of forming the crystalline semiconductor film is also the feature of the present invention.

An example of the forming method according to the present invention will be described with reference to FIG. 1. This figure is a schematic diagram showing the example in the case where only the amorphous semiconductor film of each driver circuit 103 formed on a substrate 101 are irradiated with the beam of a pulsed laser such as excimer laser.

Figure 1:
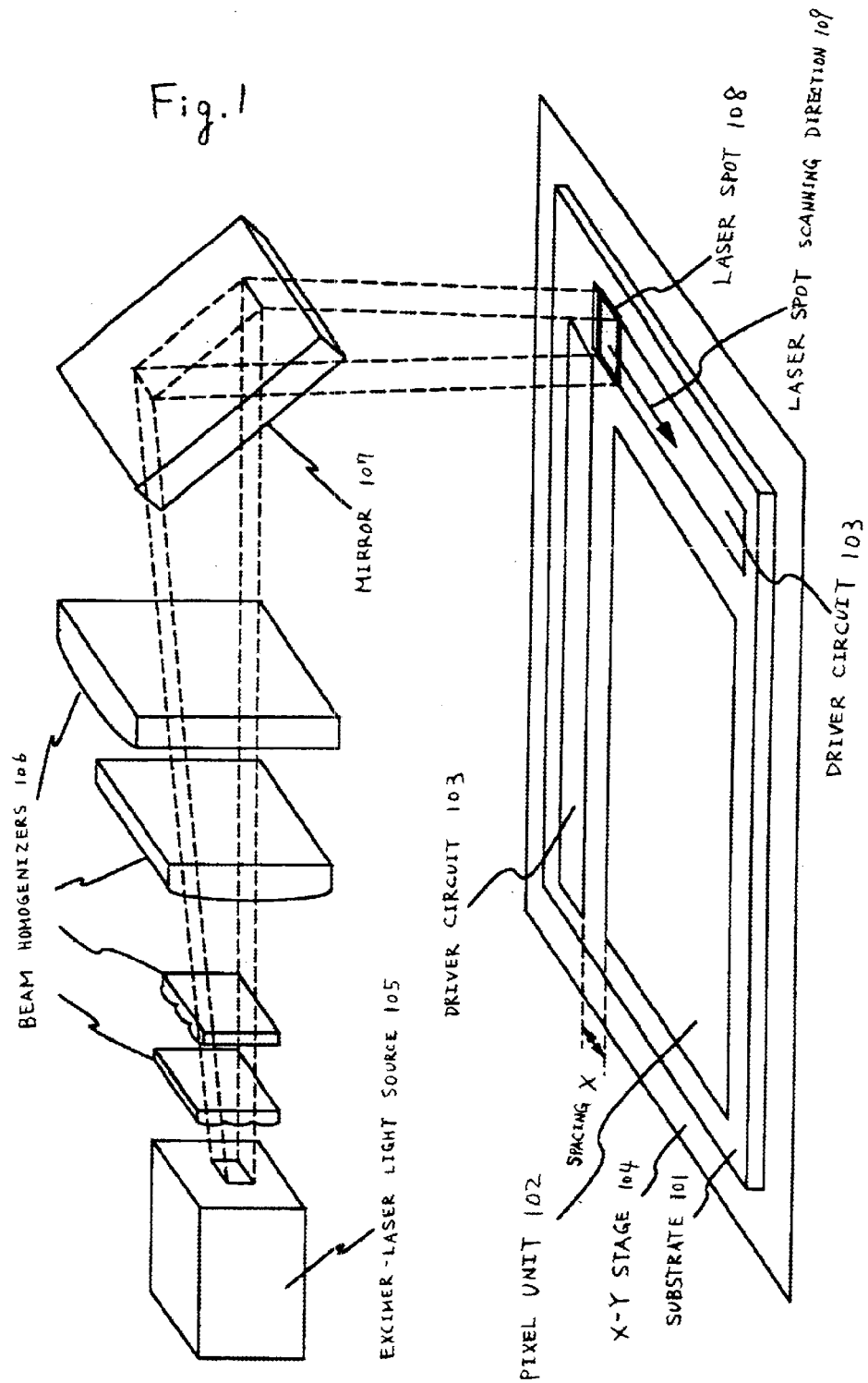
FIG. 1 is an optical arrangement diagram showing a laser irradiation method in the present invention.

Referring to FIG. 1, the substrate 101 is a refractory one, which may be a glass substrate, a quartz substrate, a silicon substrate, a ceramics substrate, or a metal substrate (typically, stainless steel substrate). In case of employing any of the substrates, a base film (preferably, an insulating film whose main component is silicon) may well be provided if necessary. Although not shown, an amorphous semiconductor film formed by sputtering is provided on the substrate 101. Accordingly, definite boundaries cannot be actually seen with the eye at this stage, but a pixel unit 102 and the driver circuits 103 to be formed later are illustrated for the sake of convenience.

The laser beam emitted from the excimer-laser light source 105 has its beam shape, energy density, etc. regulated by an optical system (beam homogenizers 106, a mirror 107, etc.), thereby to define a laser spot 108. Besides, an X-Y stage 104 to which the substrate 101 is fixed is moved in an X-direction or a Y-direction, whereby only the amorphous semiconductor film of each driver circuit 103 is irradiated with the laser spot 108 in the laser spot scanning direction 109. However, a person who controls the fabricating method should properly determine the conditions of the laser beam, etc. (the irradiating intensity of the laser beam, the pulse width thereof, the pulse repetition frequency thereof, the time period of the irradiation, the temperature of the substrate, the moving speed of the stage, the overlap ratio of scanned areas, etc.) in consideration of the thickness of the amorphous semiconductor film, etc. Here, in a case where the laser beam has leaked to irradiate the pixel unit 102, dispersion arises in the characteristics of the TFTs. It is therefore important to arrange the optical system so that the laser beam may not leak. In addition, the spacing X between the driver circuit 103 and the pixel unit 102 needs to be properly set.

When the laser irradiation method illustrated in FIG. 1 is employed, it is permitted to irradiate only the driver circuits 103 with the laser beam, and the selected parts of the amorphous silicon film can be crystallized.

Besides, apart from the pulsed laser such as excimer laser, a continuous wave laser such as argon laser, a continuous-emission excimer laser, or the like can be employed as the light source of the laser beam.

It is also allowed to employ a process in which the irradiation with the laser beam is implemented after the formation of an insulating film on the amorphous semiconductor film.

Figure 6:
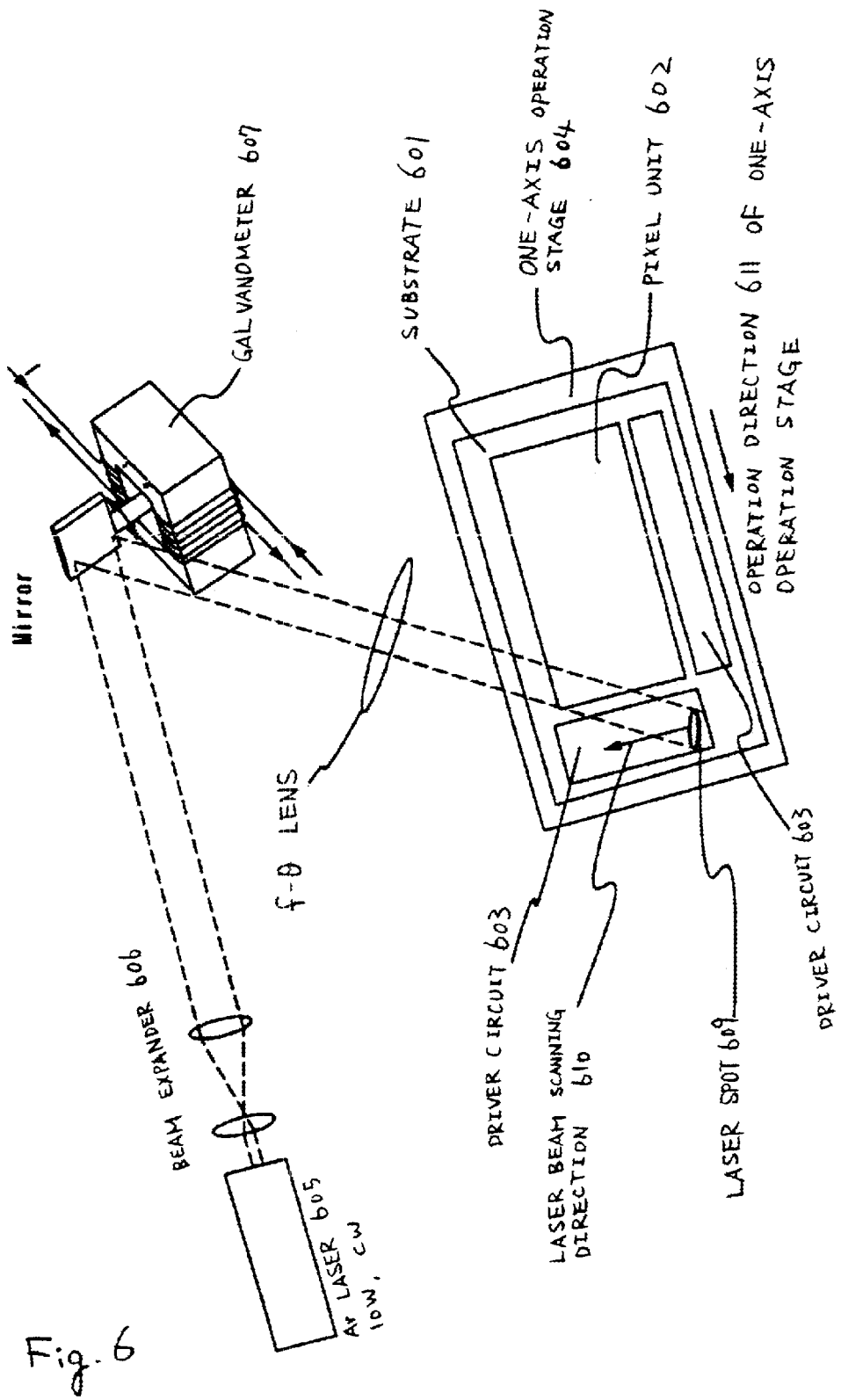
FIG. 6 is an optical arrangement diagram showing a laser irradiation method in the present invention.

FIG. 6 illustrates an example in the case where the amorphous semiconductor film of each driver circuit 603 is irradiated with the beam of a continuous wave laser such as argon laser 605. Referring to the figure, numeral 601 designates a substrate, numeral 606 a beam expander, numeral 607 a galvanometer, and numeral 604 a one-axis operation stage. Although not shown, an amorphous semiconductor film based on sputtering is provided on the substrate 601.

The laser beam emitted from the argon-laser light source 605 has its beam shape, energy density, etc. regulated by an optical system (the beam expander 606, the galvanometer 607, an f-θ (flyeye) lens 608, etc.), thereby to define a laser spot 609. Besides, the laser spot 609 is vibrated in directions parallel to a laser spot scanning direction 610 by vibrating the galvanometer 607, while at the same time, the one-axis operation stage 604 to which the substrate 601 is fixed is moved step by step (the interval of the steps being nearly equal to the diameter of the laser spot 609) in one direction (the operating direction 611 of the one-axis operation stage 604). Thus, only the amorphous semiconductor film of each driver circuit 603 is crystallized. As in the case of the laser irradiation method illustrated in FIG. 1, it is important to arrange the optical system so that the laser beam may not leak to irradiate a pixel unit 602.

When the laser irradiation method illustrated in FIG. 6 is employed, it is permitted to irradiate only the driver circuits 603 with the laser beam, and the selected parts of the amorphous silicon film can be crystallized, in the same manner as in the laser irradiation method illustrated in FIG. 1.

In addition to the construction of FIG. 1 or FIG. 6, a resist mask based on an ordinary photolithographic process may well be formed on the substrate so as to prevent the laser beam from leaking and irradiating the pixel unit. Alternatively, a photo-mask may well be employed.

Besides, although the example of defining the laser spot has been mentioned in FIG. 1 or FIG. 6, the present invention is not especially restricted thereto. It is also allowed to adopt a construction in which the selected parts of the amorphous semiconductor film are irradiated with a linear laser beam by using a mask. Alternatively, a large-area spot laser represented by "Sopra" may well be worked into the size of each driver circuit so as to implement a process for crystallizing all the amorphous semiconductor region of the driver circuit at once.

Shown in FIG. 4(C) is the sectional view of an AM-LCD in which driver circuits and a pixel unit are unitarily formed on an identical substrate by utilizing the laser-beam irradiation method of the present invention. By the way, a CMOS (complementary metal-oxide-semiconductor transistor) circuit is illustrated here as a basic circuit constituting each driver circuit, and a TFT of double-gate structure as the TFT of the pixel unit. Of course, the double-gate structure is not restrictive at all, but it may well be replaced with any of a triple-gate structure, a single-gate structure, etc.

Numeral 202 designates a silicon oxide film which is provided as a base film, and which is overlaid with the active layers of the TFTs of the driver circuit, the active layer of the TFT of the pixel unit, and a semiconductor layer to serve as the lower electrode of a retention capacitance. Here in this specification, an expression "electrode" signifies a portion which is part of a "wiring line" and at which the wiring line is electrically connected with another wiring line, or a portion at which the wiring line intersects with a semiconductor layer. Accordingly, although the expressions "wiring line" and "electrode" will be separately used for the sake of convenience, the word "electrode" shall be always implied in the expression "wiring line".

Referring to FIG. 4(C), the active layers of the TFTs of the driver circuit include the source region 221, drain region 220, LDD (lightly-doped drain) regions 228 and channel forming region 209 of the N-channel TFT (hereinbelow, shortly termed "NTFT"), and the source region 215, drain region 216 and channel forming region 217 of the P-channel TFT (hereinbelow, shortly termed "PTFT").

Besides, the active layer of the TFT (as which an NTFT is employed here) of the pixel unit includes the source region 222, drain region 224, LDD regions 229 and channel forming regions 212 thereof. Further, a semiconductor layer extended from the drain region 224 is used as the lower electrode 226 of the retention capacitance.

Incidentally, although the lower electrode 226 is directly connected with the drain region 224 of the TFT of the pixel unit in the case of FIG. 4(C), the lower electrode 226 and the drain region 224 may well be indirectly connected into a structure in which they lie in electrical connection.

The semiconductor layer as the lower electrode 226 is doped with an element which belongs to the 15th Group of elements. That is, even when any voltage is not applied to the upper wiring line 206f of the retention capacitance, the lower electrode 226 can be directly used as such. Therefore, the doping with the element is effective for diminishing the power consumption of the AM-LCD.

Besides, it is one of the features of the present invention that the channel forming regions 212 of the TFT of the pixel unit are semiconductor films in an amorphous state, whereas the channel forming regions 209, 217 of the TFTs of the driver circuit are crystalline semiconductor films having crystallinity.

It is also one of the features of the present invention that the channel forming regions 209, 212, 217 of the respective TFTs are semiconductor films which are formed by sputtering, and whose hydrogen concentrations are low. The semiconductor film formed by the sputtering exhibits the hydrogen concentration which is at least one order lower as compared with that of a semiconductor film formed by plasma CVD (chemical vapor deposition). Accordingly, the film formed by the sputtering can be followed by laser crystallization without performing a dehydrogenating treatment. In contrast, a process employing the plasma CVD has been demeritorious from the viewpoint of the safety of a job environment because of being highly liable to explosion. The present invention features that thin films, such as amorphous semiconductor films (amorphous silicon films, etc.), insulating films and conductor layers, are formed by the sputtering in order to take preference of the safety and productivity of fabrication. More preferably, the films are consecutively formed to the utmost in order to prevent them from being contaminated due to the atmospheric air.

Here, the gate insulating films of the respective TFTs are formed of an identical insulating film 205 of uniform thickness, but this is not especially restrictive. By way of example, at least two sorts of TFTs whose gate insulating films are formed of different insulating films may well exist on an identical substrate in accordance with circuit characteristics. Incidentally, when the semiconductor film and the gate insulating film are consecutively formed using the sputtering, favorably a good interface is obtained between them.

Subsequently, the gate wiring line 206d of the TFT of the driver circuit and the gate wiring line 206e of the TFT of the pixel unit are formed on the gate insulating film 205. Simultaneously, the upper electrode 206f of the retention capacitance is formed over the lower electrode 226 thereof through the gate insulating film 205.

The materials of the wiring lines in the present invention typically include conductive silicon films (for example, a phosphorus-doped silicon film and a boron-doped silicon film), and metal films (for example, a tungsten film, a tantalum film, a molybdenum film, a titanium film, an aluminum film and a copper film). They may well be silicide films produced by silicifying the metal films, and nitride films produced by nitrifying the metal films (a tantalum nitride film, a tungsten nitride film, a titanium nitride film, etc.). Moreover, the materials may well be combined and stacked at will.

Besides, in the case of employing any of the metal films, a structure in which the metal film is stacked with a silicon film is desirable for the purpose of preventing the oxidation of the metal film. In addition, a structure in which the metal film is covered with a silicon nitride film is effective in the sense of the prevention of the oxidation.

Next, numeral 230 indicates a first interlayer insulating film, which is formed of an insulating film (single layer or stacked layer) containing silicon. Any of a silicon oxide film, a silicon nitride film, an oxidized silicon nitride film (which contains nitrogen more than oxygen), and a nitrified silicon oxide film (which contains oxygen more than nitrogen) can be used as the insulating film which contains the element silicon.

Besides, the first interlayer insulating film 230 is provided with contact holes so as to form the source wiring lines 231, 233 and drain wiring line 232 of the TFTs of the driver circuit and the source wiring line 234 and drain wiring line 235 of the TFT of the pixel unit. A passivation film 236 and a second interlayer insulating film 237 are formed on the first interlayer insulating film 230 as well as the wiring lines 231–235. After the films 236, 237 have been provided with a contact hole, a pixel electrode 238 is formed.

Incidentally, a black mask (light shield film) is not formed in the example of FIG. 4(C). However, this is not especially restrictive, but the black mask may be formed as is needed. It is also allowed to employ, for example, a construction in which a counter substrate is provided with a light shield film, or a construction in which each TFT is underlaid or overlaid with a light shield film made of the same material as that of the gate wiring line.

A resin film of low relative permittivity is favorable as the second interlayer insulating film 237. Usable as the resin film is a polyimide film, an acrylic resin film, a polyamide film, a BCB (benzocyclobutene) film, or the like.

In addition, a transparent conductive film represented by an ITO (indium tin oxide) film may be used as the pixel electrode 238 in case of fabricating a transmission type AM-LCD, while a metal film of high reflectivity represented by an aluminum film may be used in case of fabricating a reflection type AM-LCD.

By the way, although the pixel electrode 238 is electrically connected with the drain region 224 of the TFT of the pixel unit through the drain electrode 235 in the structure of FIG. 4(C), this structure may well be replaced with a structure in which the pixel electrode 238 and the drain region 224 are directly connected.

The AM-LCD having the construction as described above features a high drivability, a high reliability and a high productivity on the ground that the respective circuits are formed of the TFTs of appropriate structures in accordance with their functions.

The present invention constructed as explained above will be described in more detail in conjunction with examples below.

Embodiments

Embodiment 1

In this embodiment, there will be described a fabricating process for realizing the structure of FIG. 4(C) detailed as one aspect of performance of the present invention before. Reference will be had to FIGS. 2(A)–2(D), FIGS. 3(A)–3(D) and FIGS. 4(A)–4(C).

First, a glass substrate 201 is prepared as a starting substrate. A silicon oxide film (also called a "base film") 202 being 200 [nm] thick, and an amorphous silicon film 203a being 55 [nm] thick are formed on the glass substrate 201 by sputtering them consecutively without exposing the substrate to the atmospheric air (FIG. 2(A)). Thus, boron and the like impurities contained in the atmospheric air can be prevented from adsorbing onto the lower surface of the amorphous silicon film 203a.

By the way, although the amorphous silicon film was used as an amorphous semiconductor film in an example of this embodiment, another semiconductor film may well be used. An amorphous silicon germanium film may well be employed. In addition, any of PCVD (plasma-assisted chemical vapor deposition) LPCVD (low-pressure chemical vapor deposition), sputtering, etc. can be employed as an expedient for forming the base film and the semiconductor film. Among them, the sputtering is desirable because it is excellent in the points of safety and productivity. A sputtering apparatus used in this embodiment includes a chamber, an evacuation system for bringing the interior of the chamber into a vacuum, a gas introduction system for introducing a sputtering gas into the chamber, an electrode system configured of a target, an RF (radio frequency) electrode, etc., and a sputtering power source connected to the electrode system. In the example of this embodiment, argon (Ar) was used as the sputtering gas, and a silicon target as the target.

Since, in this embodiment, the channel forming region of the TFT of a pixel unit is to be made of the amorphous silicon film (the field effect mobility $M_{FE}$ of the NTFT made from the amorphous silicon film is lower than 1.0 [cm$^2$/Vs]), the channel length of the TFT and the thickness of the amorphous silicon film need to be set at appropriate values.

Subsequently, the part 204a of the amorphous silicon film 203a is crystallized. A known technique, such as laser crystallization or thermal crystallization employing a catalyst element, is used as an expedient for the crystallization. In the example of this embodiment, the laser crystallization was implemented in conformity with the laser irradiation method schematically illustrated in FIG. 1. A laser beam emitted from an excimer-laser light source 105 had its beam shape, energy density, etc. regulated by an optical system (beam homogenizers 106, a mirror 107, etc.), thereby to define a laser spot 108. Besides, an X-Y stage 104 to which the substrate 201 (101 in FIG. 1) was fixed was moved in an X-direction or a Y-direction, whereby only the amorphous semiconductor film of each driver circuit 103 was irradiated with the laser spot 108 in a laser spot scanning direction 109. Thus, only the region of the driver circuit was subjected to the laser irradiation and was selectively crystallized, and the region 204a made of a crystalline silicon (polysilicon) film was formed (FIG. 2(B)).

Since, in this embodiment, the channel forming region of the TFT of the driver circuit is to be made of the crystalline silicon film (the field effect mobility $M_{FE}$ of the NTFT made from the crystalline silicon film is 1.0 [cm$^2$/Vs] or higher), the optimum channel length of the TFT and the thickness of the amorphous silicon film enough to be laser-crystallized need to be appropriately set. Considering these necessities, the channel length may be 3–10 [μm], and the thickness of the amorphous silicon film may be 10–200 [nm], preferably 30–70 [nm].

Thereafter, the crystalline silicon (polysilicon) film 204a obtained is patterned to form the semiconductor layer 204b of the TFT of the driver circuit, and the resulting amorphous silicon film 203a is patterned to form the semiconductor layer 203b of the TFT of the pixel unit (FIG. 2(C)).

Incidentally, before or after forming the respective semiconductor layers 203b, 204b of the TFTs of the pixel unit and the driver circuit, the crystalline silicon film 204a may well be doped with an impurity element (phosphorus or boron) for controlling the threshold voltage of the TFT of the driver circuit. This step may be implemented for only the NTFT or PTFT, or for both the NTFT and PTFT.

Subsequently, a gate insulating film 205 is formed by sputtering or plasma CVD, whereupon a first conductive film 206a and a second conductive film 207a are stacked and formed by sputtering (FIG. 2(D)).

The gate insulating film 205 is to function as the gate insulating films of the TFTs, and is endowed with a thickness of 50–200 [nm]. In the example of this embodiment, a silicon oxide film being 100 [nm] thick was formed by the sputtering which employed silicon oxide as a target. The mere silicon oxide film is not restrictive, but it can be replaced with a stacked structure in which the silicon oxide film is overlaid with a silicon nitride film. It is also allowed to employ a nitrified silicon oxide film in which the silicon oxide film is doped with nitrogen.

By the way, this embodiment has mentioned the example in which, after the laser crystallization of the amorphous silicon film is carried out, the patterning is implemented, followed by the formation of the gate insulating film. However, the fabricating process is not especially restricted to the sequence of the steps, but it may well be replaced with a process in which, after the amorphous silicon film and the gate insulating film are consecutively formed by sputtering, the laser crystallization is carried out, followed by the implementation of the patterning. In the case of consecutively forming the films by the sputtering, good interface properties are attained.

In addition, the first conductive film 206a is made of a conductive material whose main component is an element selected from the group consisting of Ta (tantalum), Ti (titanium), Mo (molybdenum) and W (tungsten). The thickness of the first conductive film 206a may be set at 5–50 [nm], preferably 10–25 [nm]. On the other hand, the second conductive film 207a is made of a conductive material whose main component is an element Al (aluminum), Cu (copper) or Si (silicon). The thickness of the second conductive film 207a may be set at 100–1000 [nm], preferably 200–400 [nm]. The second conductive film 207a is provided in order to lower the wiring resistance of a gate wiring line or a gate bus line.

At the next step, the unnecessary part of the second conductive film 207a is removed by patterning, whereby an electrode 207b to become part of the gate bus line is formed in a wiring portion. Thereafter, resist masks 208a–208d are formed. More specifically, the resist mask 208a is formed so as to cover the PTFT of the driver circuit, while the resist mask 208b is formed so as to cover the channel forming region of the NTFT of the driver circuit. Besides, the resist mask 208c is formed so as to cover the electrode 207b, while the resist masks 208d are formed so as to cover the channel forming regions of the pixel unit. Further, using the resist masks 208a–208d, the resulting substrate is doped with an impurity element bestowing the n-conductivity type, thereby to form impurity regions 210, 211 (FIG. 3(A)).

In the example of this embodiment, phosphorus (P) was used as the impurity element bestowing the n-conductivity type, and ion doping was carried out by employing phosphine (PH$_3$). Since, at this step, the element phosphorus is passed through the gate insulating film 205 and the first conductive film 206a so as to dope the underlying semiconductor layers 203b, 204b with the element phosphorus, the acceleration voltage of the ion doping is set at a somewhat high voltage of 80 [keV]. The concentration of the element phosphorus to be introduced into the semiconductor layers 203b, 204b as a dopant, should preferably be set within a range of $1 \times 10^{16} - 1 \times 10^{19}$ [atoms/cm$^3$]. Here in the example, the concentration was set at $1 \times 10^{18}$ [atoms/cm$^3$]. Thus, the regions 210, 211 doped with the element phosphorus are formed in the semiconductor layers. Parts of the phosphorus-doped regions formed here function as LDD regions. Besides, parts of regions covered with the masks and not doped with the element phosphorus (regions 209 made of the crystalline silicon film, and regions 212 made of the amorphous silicon film) function as the channel forming regions.

Incidentally, the step of doping with the element phosphorus may be implemented by either of ion implantation which separates masses and plasma doping which does not separate masses. Regarding such conditions as the acceleration voltage and the dose, a person who controls the fabricating method may be set the optimum values.

Subsequently, the resist masks 208a–208d are removed, and an activating process is carried out if necessary. Besides, a third conductive film 213a is formed by sputtering (FIG. 3(B)). The third conductive film 213a is made of the conductive material whose main component is the element selected from the group consisting of Ta (tantalum), Ti (titanium), Mo (molybdenum) and W (tungsten). Besides, the thickness of the third conductive film 213a is set at 100–1000 [nm], preferably 200–500 [nm].

Subsequently, resist masks 214a–214d are formed anew, and the conductive film 213a, etc. are patterned, thereby to form the gate electrode 206b, 213b of the PTFT and to form the wiring line 206c, 213c. Thereafter, using the masks 214a–214d left intact, the resulting substrate is doped with an impurity element bestowing the p-conductivity type, thereby to form the source region and drain region of the PTFT (FIG. 3(C)). Here in the example, boron (B) was used as the impurity element, and ion doping was carried out by employing diborane (B$_2$H$_6$). Also here, the acceleration voltage of the ion doping was set at 80 [keV], and the element boron was introduced at a concentration of $2 \times 10^{20}$ [atoms/cm$^3$].

Subsequently, the resist masks 214a–214d are removed, and resist masks 218a–218e are formed anew. Thereafter, using the resist masks 218a–218e, the resulting substrate is etched so as to form the gate wiring line 206d, 213d of the NTFT of the driver circuit, the gate wiring lines 206e, 213e of the TFT of the pixel unit, and the upper wiring line 206f, 213f of a retention capacitance (FIG. 3(D)).

Next, the resist masks 218a–218e are removed, and resist masks 219 are formed anew. Thereafter, the resulting substrate is doped with an impurity element bestowing the n-conductivity type on the source regions and drain regions of the NTFTs, thereby to form impurity regions 202–225 (FIG. 4(A)). Here in the example, ion doping was carried out by employing phosphine (PH$_3$). The concentration of phosphorus contained in the impurity regions 220–225 is higher as compared with the phosphorus concentration at the foregoing step of doping with the impurity element which bestows the n-conductivity type, and it should preferably be set at $1 \times 10^{19} - 1 \times 10^{21}$ [atoms/cm$^3$]. Here in the example, the concentration was set at $1 \times 10^{20}$ [atoms/cm$^3$].

Thereafter, the resist masks 219 are removed, and a protective film 227 made of a silicon nitride film having a thickness of 50 [nm] is formed. Then, a state illustrated in FIG. 4(B) is obtained.

Subsequently, an activating process is carried out for activating the introduced impurity element which bestows the nor p-conductivity type. The processing step may be implemented by thermal annealing which employs an electric heating furnace, laser annealing which employs the excimer laser explained before, or rapid thermal annealing (RTA) which employs a halogen lamp. In the case of heat treatment, a heating temperature is set at 300–700 [° C.], preferably 350–550 [° C.]. In the example of this embodiment, the resulting substrate was heat-treated at 450 [° C.] in a nitrogen atmosphere for 2 hours.

Subsequently, a first interlayer insulating film 230 is formed, contact holes are provided, and source electrodes and drain electrodes 231–235, etc. are formed by known techniques.

Thereafter, a passivation film 236 is formed. Usable as the passivation film 236 is a silicon nitride film, an oxidized silicon nitride film, a nitrified silicon oxide film, or a stacked film consisting of such an insulating film and a silicon oxide film. In the example of this embodiment, the silicon nitride film having a thickness of 300 [nm] was used as the passivation film 236.

By the way, in this embodiment, a plasma process employing ammonia gas is carried out as preprocessing for the formation of the silicon nitride film, and it is directly followed by the formation of the passivation film 236. Since hydrogen activated (excited) by a plasma owing to the preprocessing is confined within the passivation film 236, hydrogen termination in the active layers (semiconductor layers) of the TFTs can be promoted.

Further, in a case where nitrous oxide gas is added into a gas containing hydrogen, the surface of the object to-be-processed (the resulting substrate) is washed with a produced water content, and it can be effectively prevented from being contaminated especially with boron etc. contained in the atmospheric air.

When the passivation film 236 has been formed, an acrylic resin film being 1 [μm] thick is formed as a second interlayer insulating film 237. Thereafter, a contact hole is provided by patterning the films 236 and 237, and a pixel electrode 238 made of an ITO film is formed. In this way, the AM-LCD of the structure as shown in FIG. 4(C) is finished up.

Owing to the above steps, the NTFT of the driver circuit is formed with the channel forming region 209, impurity regions 220, 221, and LDD regions 228. The impurity region 220 serves as a source region, while the impurity region 221 serves as a drain region. Besides, the NTFT of the pixel unit is formed with the channel forming regions 212, impurity regions 222–225, and LDD regions 229. Here, each of the LDD regions 228, 229 is formed with a region overlapped by the gate electrode (GOLD region: Gate-drain Overlapped LDD region), and a region not overlapped by the gate electrode (LDD region).

On the other hand, the P-conductivity type TFT of the driver circuit is formed with a channel forming region 217 and impurity regions 215, 216. Here, the impurity region 215 serves as a source region, while the impurity region 216 serves as a drain region.

In this manner, the present invention features the point of forming on the identical substrate the TFT of the pixel unit having the channel forming regions 212 made of the amorphous silicon film, and the TFTs of the driver circuit having the channel forming regions 209, 217 made of the crystalline silicon film. Owing to such a construction, it is permitted to form the TFTs of the pixel unit having a high uniformity and the TFTs of the driver circuit having a high mobility on the identical substrate.

FIG. 5(A) illustrates an example of the circuit arrangement of a liquid crystal display device of active matrix type. The active matrix type liquid crystal display device in this embodiment comprises a source signal line side driver circuit 301, a gate signal line side driver circuit (A) 307, a gate signal line side driver circuit (B) 311, a precharge circuit 312, and a pixel unit 306.

The source signal line side driver circuit 301 includes a shift register circuit 302, a level shifter circuit 303, a buffer circuit 304, and a sampling circuit 305.

On the other hand, the gate signal line side driver circuit (A) 307 includes a shift register circuit 308, a level shifter circuit 309, and a buffer circuit 310. The gate signal line side driver circuit (B) 311 is similarly constructed.

In this embodiment, the circuits except the pixel unit are constructed as the driver circuits, and the semiconductor layers of the corresponding regions are crystallized, but the present invention is not especially restricted thereto. More specifically, those of the driver circuits for which a reliability is required rather than a high mobility need not be crystallized. By way of example, the buffer circuit in each of the driver circuits may well have the channel forming region of its TFT made of a semiconductor layer of amorphous state likewise to that of the NTFT of the pixel unit.

Moreover, according to the present invention, the lengths of LDD regions are readily made unequal on an identical substrate in consideration of the drive voltages of the NTFTs, and the optimum shapes can be formed for the TFTs constituting the respective circuits, by an identical step.

FIG. 5(B) illustrates the top plan view of the pixel unit. Since the A–A' sectional structure of a TFT portion and the B–B' sectional structure of a wiring portion correspond to those same reference numerals as in FIG. 4(C). In FIG. 5(B), numeral 401 designates a semiconductor layer, numeral 402 agate electrode, and symbol 403a a capacitor line. In this embodiment, each of the gate electrode 402 and a gate wiring line 403b is formed of a first conductive layer and a third conductive layer, and a gate bus line has a clad structure formed of the first conductive layer, a second conductive layer and the third conductive layer.

In addition, FIG. 10(A) illustrates the top plan view of a CMOS circuit which is the constituent part of the driver circuit, and it corresponds to FIG. 4(C). In this example, the active layers of the NTFT and PTFT lie in direct contact, and one drain electrode is shared. However, the present invention is not especially restricted to the above structure, but it may well employ a structure as shown in FIG. 10(B) (where the active layers are perfectly separated).

Embodiment 2

In this embodiment, an example in which an amorphous semiconductor film is selectively crystallized using a laser different from the laser in Embodiment 1 will be described below with reference to FIG. 6. Since this embodiment is the same as Embodiment 1 except the step of the laser crystallization, it shall be explained with note taken only of different points.

First, a silicon oxide film (subbing film) and an amorphous silicon film are consecutively formed on a substrate in conformity with the fabricating process of Embodiment 1. In the example of this embodiment, the substrate was a quartz substrate. By the way, the thickness of the amorphous silicon film should preferably be set at 100 [nm] or more in relation to the absorption coefficient of the argon laser.

At the next step of the laser crystallization, the selected parts of the amorphous silicon film are crystallized by employing the irradiation method illustrated in FIG. 6. A laser beam emitted from an argon-laser light source 605 had its beam shape, energy density, etc. regulated by an optical system (a beam expander 606, a galvanometer 607, an f-θ (flyeye) lens 608, etc.), thereby to define a laser spot 609. Besides, the laser spot 609 was vibrated in directions parallel to a laser spot scanning direction 610 by vibrating the galvanometer 607, while at the same time, a one-axis operation stage 604 to which the substrate 601 was fixed was moved step by step (the interval of the steps being nearly equal to the diameter of the laser spot 609) in one direction (the operating direction 611 of the one-axis operation stage 604). Thus, only the amorphous semiconductor film of each driver circuit 603 was selectively crystallized, so that each region made of a crystalline silicon (polysilicon) film was formed.

When the succeeding steps are conformed to those of Embodiment 1, the state shown in FIG. 4(C) can be obtained.

Embodiment 3

In the fabricating process described in Embodiment 1 or 2, only the driver circuits are selectively irradiated with the laser beam by employing the laser irradiation method illustrated in FIG. 1 or FIG. 6. It is also possible, however, to irradiate the selected parts with the laser beam by forming an ordinary resist mask.

In this case, a conventional laser irradiation apparatus is usable as it is. Accordingly, the laser irradiation can be easily implemented without altering the apparatus, and it can be said an effective technique.

Moreover, the construction of this embodiment can be combined with either of Embodiments 1 and 2 at will.

Embodiment 4

In this embodiment, an example in the case of fabricating an AM-LCD by a process different from that of Embodiment 1 will be described with reference to FIGS. 7(A)–7(C), FIGS. 8(A)–8(D) and FIGS. 9(A)–9(C). Whereas the top gate type TFTs have been exemplified in Embodiment 1, bottom gate type TFTs will be exemplified in this embodiment.

First, gate electrodes 702 of stacked structure (not shown for the sake of brevity) are formed on a glass substrate 701. In the example of this embodiment, a tantalum nitride film and a tantalum film were stacked and formed by sputtering, and they were worked into gate wiring lines (including the gate electrodes) 702a–702c and a capacitor wiring line 702d by known patterning.

Subsequently, a gate insulating film and an amorphous semiconductor film are stacked and formed successively without exposing the substrate to the atmospheric air. In the example of this embodiment, a stacked layer consisting of a silicon nitride film 703 and a silicon oxide film 704 was formed by the sputtering, and it was employed as the gate insulating film of stacked structure. Next, an amorphous silicon film 765 as the amorphous semiconductor film was formed by the sputtering without exposing the substrate to the atmospheric air (FIG. 7(A)). Although the amorphous semiconductor film formed by the sputtering has a low hydrogen concentration, a heat treatment for lessening, the hydrogen concentration still further may well be carried out.

Since, in this embodiment, the channel forming region of the TFT of a pixel unit is to be made of the amorphous silicon film (the field effect mobility $M_{FE}$ of the NTFT made from the amorphous silicon film is lower than 1.0 [cm$^2$/Vs]), the channel length of the TFT and the thickness of the amorphous silicon film need to be set at appropriate values.

Subsequently, the amorphous silicon film 705 is selectively subjected to laser crystallization, thereby to form a crystalline silicon film 706. In the example of this embodiment, only each of driver circuits was irradiated with a laser beam by employing the laser irradiation method illustrated in FIG. 1 (FIG. 7(B)).

Since, in this embodiment, the channel forming region of the TFT of the driver circuit is to be made of the crystalline silicon film (the field effect mobility $M_{FE}$ of the NTFT made from the crystalline silicon film is 1.0 [cm$^2$/Vs] or higher), the optimum channel length of the TFT and the thickness of the amorphous silicon film enough to be laser-crystallized need to be appropriately set. Considering these necessities, the channel length may be 3–10 [Mm], and the thickness of the amorphous silicon film may be 10–200 [nm], preferably 30–70 [nm].

Subsequently, a channel protection film 707 for protecting the channel forming regions is formed. The channel protection film 707 may be formed by known patterning. In the example of this embodiment, the film 707 was patterned using a photo-mask. In this state, the upper surface of the crystalline silicon film or amorphous silicon film except regions lying in touch with the channel protection film 707 is denuded (FIG. 7(C)). By the way, in a case where the film 707 is patterned by exposing the rear surface of the resulting substrate to light, the photo-mask is unnecessary, and hence, the number of processing steps can be decreased.

Subsequently, a resist mask 708 which covers parts of the PTFT and NTFT of the driver circuit and the NTFT of the pixel unit is formed by patterning which employs a photo-mask. Next, the resulting substrate is doped with an impurity element bestowing the n-conductivity type (phosphorus in this embodiment), thereby to form impurity regions 709 (FIG. 8(A)).

Subsequently, the resist mask 708 is removed, and the whole surface of the resulting substrate is covered with a thin insulating film 710. The thin insulating film 710 is formed in order to dope the substrate with an impurity element at a lower concentration later, and it is not always necessary (FIG. 8(B)).

Subsequently, the resulting substrate is doped with the impurity element at the concentration which is lower as compared with the phosphorus concentration at the preceding step of doping with the impurity element (FIG. 8(C)). Owing to the step shown in FIG. 8(C), the part of the crystalline silicon film covered with the channel protection film 707 (707b in FIG. 7(C)) is turned into the channel forming region 713, and the parts of the amorphous silicon film covered with the channel protection film 707 (707c in FIG. 7(C)) are turned into the channel forming regions 714. In addition, the LDD regions 711, 712 of the NTFTs are formed by this step.

At the next step, a resist mask 715 which covers the entire surfaces of the N-channel TFTs is formed, and the resulting substrate is doped with an impurity element which bestows the p-conductivity type (FIG. 8(D)). Owing to this step, the part of the crystalline silicon film covered with the channel protection film 707 (707a in FIG. 7(C)) is turned into the channel forming region 716 of the PTFT, and the source region and drain region 717 of the PTFT are formed.

Subsequently, the resist mask 715 is removed, and the semiconductor layers are patterned into desired shapes (FIG. 9(A)).

Subsequently, a first interlayer insulating film 722 is formed, contact holes are provided, and source electrodes and drain electrodes 723–727, etc. are formed by known techniques.

Thereafter, a passivation film 728 is formed (FIG. 9(B)). Usable as the passivation film 728 is a silicon nitride film, an oxidized silicon nitride film, a nitrified silicon oxide film, or a stacked film consisting of such an insulating film and a silicon oxide film. In the example of this embodiment, the silicon nitride film having a thickness of 300 [nm] was used as the passivation film 728.

By the way, in this embodiment, a plasma process employing ammonia gas is carried out as preprocessing for the formation of the silicon nitride film, and it is directly followed by the formation of the passivation film 728. Since hydrogen activated (excited) by a plasma owing to the preprocessing is confined within the passivation film 728, hydrogen termination in the active layers (semiconductor layers) of the TFTs can be promoted.

When the passivation film 728 has been formed, an acrylic resin film being 1 [$\mu$m] thick is formed as a second interlayer insulating film 729. Thereafter, a contact hole is provided by patterning the films 728 and 729, and a pixel electrode 730 made of an ITO film is formed. In this way, the AM-LCD of the structure as shown in FIG. 9(C) is finished up.

Moreover, the construction of this embodiment can be combined with either of Embodiments 2 and 3 at will.

Embodiment 5

In this embodiment, there will be described a case where another expedient is employed for the formation of a crystalline silicon film in Embodiment 1.

Concretely, a technique disclosed as Embodiment 2 in the official gazette of Japanese Patent Application Laid-open No. 130652/1995 (corresponding to U.S. Pat. No. 08/329, 644) is adopted for the crystallization of an amorphous silicon film. The technique disclosed in the official gazette is such that a catalyst element promoting crystallization (cobalt, vanadium, germanium, platinum, iron or copper, and typically nickel) is borne on the selected part of the surface of the amorphous silicon film, and that the amorphous silicon film is crystallized using the part as the seed of nucleus growth.

According to the technique, crystal growth can be endowed with a specified orientation, and hence, the crystalline silicon film of very high crystallinity can be formed.

Incidentally, the construction of this embodiment can be combined with the construction of any of Embodiments 1–4 at will.

Embodiment 6

In this embodiment, there will be described a case where another expedient is employed for the formation of a crystalline silicon film in Embodiment 1.

In an example of this embodiment, nickel is selected as a catalyst element, a nickel containing layer is formed on an amorphous silicon film, and the amorphous silicon film is selectively irradiated with a laser beam, thereby to be crystallized.

Subsequently, a resist mask is formed on the resulting silicon film, so as to implement the step of doping the resulting substrate with an element which belongs to the 15th family of elements (phosphorus in this embodiment). The concentration of the element phosphorus to be introduced as a dopant should preferably be $5\times10^{18}$–$1\times10^{20}$ [atoms/cm$^3$], (more preferably, $1\times10^{19}$–$5\times10^{19}$ [atoms/ cm$^3$]. Since, however, the concentration of the dopant phosphorus to be introduced changes depending upon the temperature and time period of a later gettering step and the area of phosphorus-doped regions, the above concentration range is not restrictive. Thus, the regions doped with the element phosphorus (the phosphorus-doped regions) are formed.

The resist mask is arranged so as to denude part (or the whole) of a region which is to become the source region or drain region of the TFT of each driver circuit later. Likewise, the resist mask is arranged so as to denude part (or the whole) of a region which is to become the source region or drain region of the TFT of a pixel unit later. On this occasion, the resist mask is not arranged on a region which is to become the lower electrode of a retention capacitor, and hence, the region is entirely doped with the dopant phosphorus into the phosphorus-doped region.

Subsequently, the resist mask is removed, and a heat treatment at 500–650[° C.] is carried out for 2–16 [hours], thereby to getter the catalyst element (nickel in this embodiment) used for the crystallization of the silicon film. A temperature on the order of ±50 [° C.] with respect to the highest temperature of a thermal hysteresis is required for attaining a gettering action. In this regard, a heat treatment for the crystallization is implemented at 550–600 [° C.], so that the heat treatment at 500–650 [° C.] suffices to attain the gettering action.

Besides, the crystalline silicon (polysilicon) film from which the catalyst element has been diminished is patterned, thereby to form the crystalline semiconductor layer of the TFT of the driver circuit and the amorphous semiconductor layer of the TFT of the pixel unit. The succeeding steps may be conformed to those of Embodiment 1.

Incidentally, the construction of this embodiment can be combined with the construction of any of Embodiments 1–5 at will.

Embodiment 7

In this embodiment, there will be described an example in which source regions and drain regions of TFTs are formed by doping semiconductor layers with elements which belong to the 13th family and 15th family of elements, in a sequence different from the doping sequence in Embodiment 1. In the present invention, the sequence of doping operations can be altered on occasion. The doping sequence exemplified in Embodiment 1 is such that the dopant phosphorus at the low concentration is first introduced, that the dopant boron is secondly introduced, and that the dopant phosphorus at the high concentration is thirdly introduced. In the example of this embodiment, the dopant phosphorus at the high concentration is first introduced after the state shown in FIG. 3(B) has been obtained.

The state of FIG. 3(B) is obtained in conformity with the processing steps of Embodiment 1.

Subsequently, a resist mask for forming the wiring lines of the NTFTs is formed. The resist mask covers the region of the PTFT of the driver circuit. Using the resist mask, the resulting substrate is etched so as to form the gate wiring line of the NTFT of the driver circuit, the gate wiring lines of the TFT of the pixel unit, and the upper wiring line of the retention capacitance.

Subsequently, the resist mask is removed, and a resist mask is formed a new. Thereafter, the resulting substrate is doped with the impurity element bestowing the n-conductivity type on the source regions and drain regions of the NTFTs, thereby to form impurity regions. On this occasion, the concentration of the element phosphorus to be introduced is 5×10$^{19}$–1×10$^{21}$ [atoms/cm$^3$].

Next, a resist mask which covers a region except the region of the PTFT is formed. In this state, the step of doping with the element boron is implemented. On this occasion, the concentration of the element boron to be introduced is 1×10$^{20}$–3×10$^{21}$ [atoms/cm$^3$]. Thus, the source region, drain region and channel forming region of the PTFT are defined.

The succeeding steps may be conformed to the fabricating process of Embodiment 1. The construction of this embodiment can be combined with the construction of any of Embodiments 1–6 at will.

Embodiment 8

The present invention is also applicable to a case where an interlayer insulating film is formed on conventional MOSFETs (metal-oxide-semiconductor field effect transistors), and where TFTs are formed on the interlayer insulating film. That is, the present invention can incarnate a semiconductor device of multilevel structure in which a reflection type AM-LCD is formed on a semiconductor circuit.

Besides, the above semiconductor circuit may well be one formed on an SOI (Silicon On Insulator) substrate such as "SIMOX" or "Smart-Cut" (registered trademark of SOITEC Inc.) or "ELTRAN" (registered trademark of Canon Inc.).

By the way, in performing this embodiment, the construction of any of Embodiments 1–7 may well be combined.

Embodiment 9

In this embodiment, there will be described a case where TFTs were formed on a substrate by the fabricating process of Embodiment 1, and where an AM-LCD was actually fabricated.

When the state of FIG. 4(C) has been obtained, an orientation film is formed on the pixel electrode 238 to a thickness of 80 [nm]. Subsequently, a glass substrate on which a color filter, a transparent electrode (counter electrode) and an orientation film are formed is prepared as a counter substrate, and the respective orientation films are subjected to rubbing. The substrate formed with the TFTs, and the counter substrate are stuck together by the use of a sealing member. Besides, a liquid crystal is held between both the substrates. Such a cell assemblage step may be resorted to a known expedient, and shall be omitted from detailed description.

Incidentally, a spacer for keeping a cell gap may be disposed if necessary. It need not be especially disposed in a case where the cell gap can be kept without any spacer as in an AM-LCD which is at most 1 [inch] long diagonally.

Figure 11:
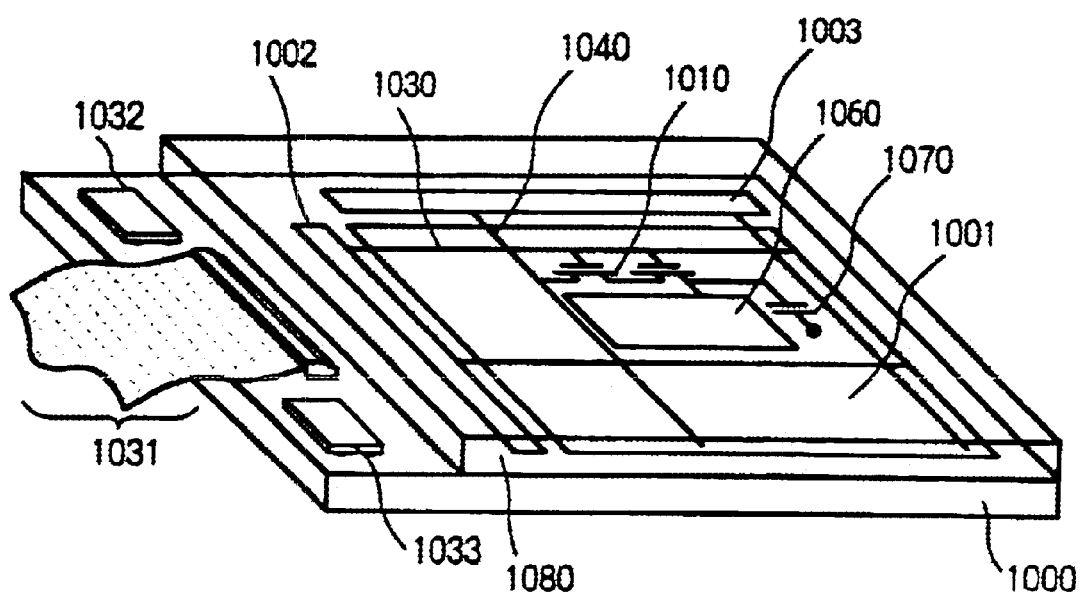
FIG. 11 is a perspective view showing the external appearance of an AM-LCD.

The external appearance of the AM-LCD fabricated in the above way, is illustrated in FIG. 11. As shown in FIG. 11, an active matrix substrate and the counter substrate oppose to each other, and the liquid crystal is sandwiched in between the substrates. The active matrix substrate includes a pixel unit 1001, a scanning line driver circuit 1002 and a signal line driver circuit 1003 which are formed on the substrate 1000.

The scanning line driver circuit 1002 and the signal line driver circuit 1003 are respectively connected to the pixel unit 1001 by scanning lines 1030 and signal lines 1040. Each of the driver circuits 1002, 1003 is mainly constructed of a CMOS circuit.

The scanning line 1030 is laid every row of the pixel unit 1001, while the signal line 1040 is laid every column thereof. The TFT 1010 of the pixel unit is formed in the vicinity of the intersection part between the scanning line 1030 and the signal line 1040. The gate electrodes of the TFT 1010 of the pixel unit are connected to the scanning line 1030, and the source thereof is connected to the signal line

1040. Further, a pixel electrode 1060 and a retention capacitance 1070 are connected to the drain of the TFT 1010.

The counter substrate 1080 is formed with a transparent conductive film, such as ITO film, over its whole surface. The transparent conductive film functions as a counter electrode for the pixel electrode 1060 of the pixel unit 1001, and the liquid crystal material is driven by an electric field established between the pixel electrode and the counter electrode. If necessary, the counter substrate 1080 is formed with the orientation film, a black mask or a color filter.

IC chips 1032, 1033 are mounted on the substrate of the active matrix substrate side by utilizing a surface to which an FPC (flexible printed circuit) 1031 is attached. The IC chips 1032, 1033 are so constructed that circuits, such as a video signal processing circuit, a timing pulse generator circuit, a γ correction circuit, a memory circuit and an arithmetic circuit, are formed on a silicon substrate.

Further, although the liquid crystal display device is exemplified in this embodiment, the present invention is also applicable to any display device of active matrix type, such as an EL (electroluminescent) display device or an EC (electrochromic) display device.

Incidentally, this embodiment can be combined with any of Embodiments 1–8 at will.

Embodiment 10

In this embodiment, an example in which an EL display device of active matrix type was fabricated by adopting the present invention will be described with reference to FIG. 12 and FIGS. 13(A) and 13(B).

Figure 12:
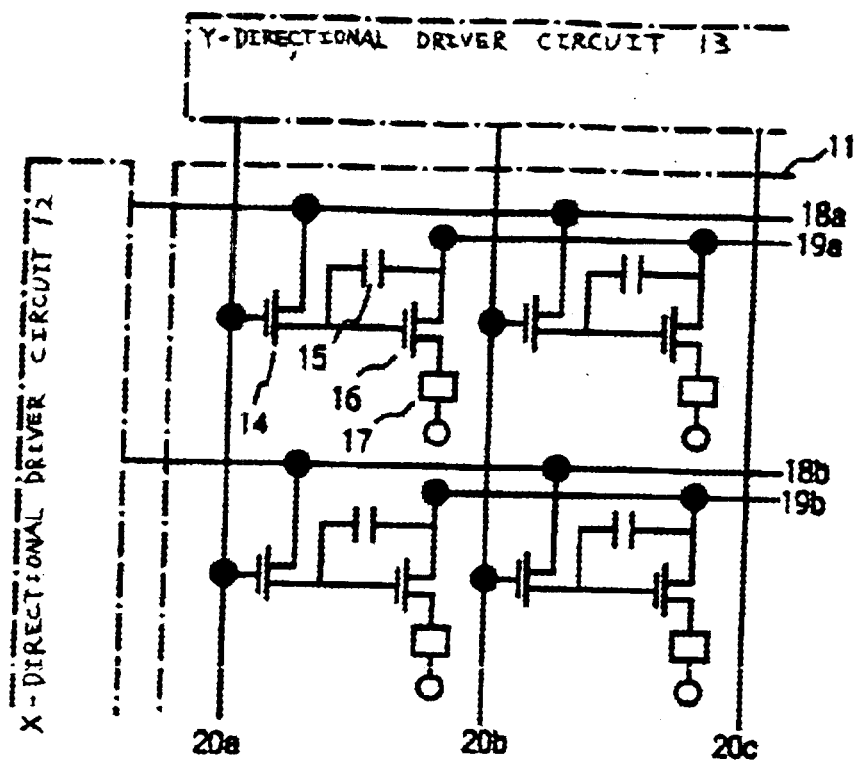
FIG. 12 is a circuit diagram showing an active matrix type EL (electroluminescent) display device.

FIG. 12 schematically shows the circuit diagram of the active matrix type EL display device. Numeral 11 designates a pixel unit, around which an X-directional driver circuit 12 and a Y-directional driver circuit 13 are disposed. In addition, each pixel of the pixel unit 11 includes a switching TFT 14, a capacitor 15, a current controlling TFT 16 and an organic EL element 17. Herein, an X-directional signal line 18a (or 18b) and a Y-directional signal line 20a (20b or 20c) are connected to the switching TFT 14. Also, a power source line 19a (or 19b) is connected to the current controlling TFT 16.

In this embodiment, the semiconductor layers of TFTs in the X-directional driver circuit 12 as well as the Y-directional driver circuit 13 are made of polysilicon, whereas the semiconductor layers of the TFTs in the pixel unit 11 are made of amorphous silicon.

Besides, the TFTs in the X-directional driver circuit 12 as well as the Y-directional driver circuit 13 have the GOLD structure, whereas the switching TFT 14 and the current controlling TFT 16 have the LDD structure.

Figure 13A:
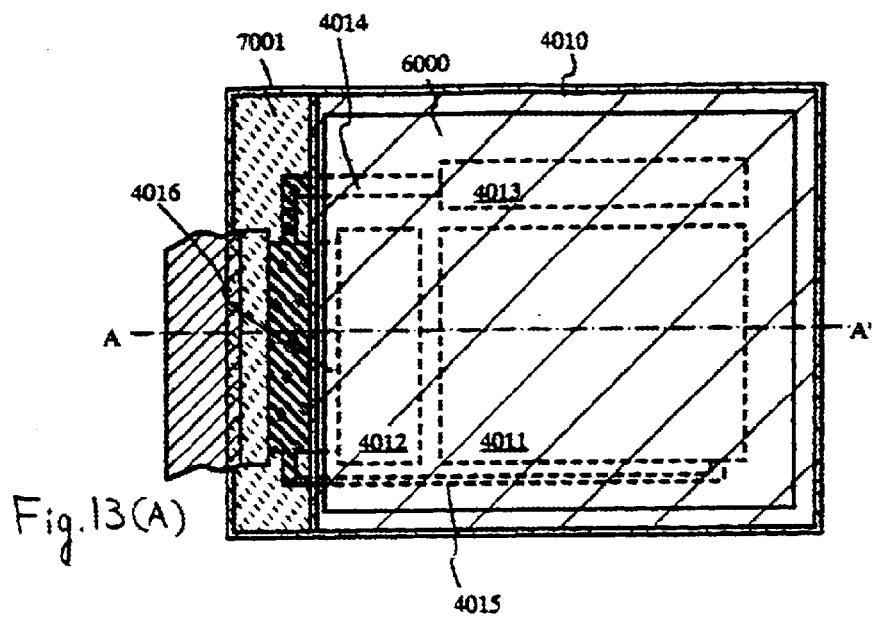
FIGS. 13(A) and 13(B) are a top plan view and a sectional view showing the active matrix type EL display device, respectively.

FIG. 13(A) is the top plan view of the EL display device adopting the present invention. Referring to the figure, numeral 4010 designates a substrate, numeral 4011 a pixel unit, numeral 4012 a source side driver circuit, and numeral 4013 a gate side driver circuit. The respective driver circuits are led to an FPC 4017 (FIG. 13(B)) via wiring lines 4014–4016, and are connected to an external equipment.

Figure 13B:
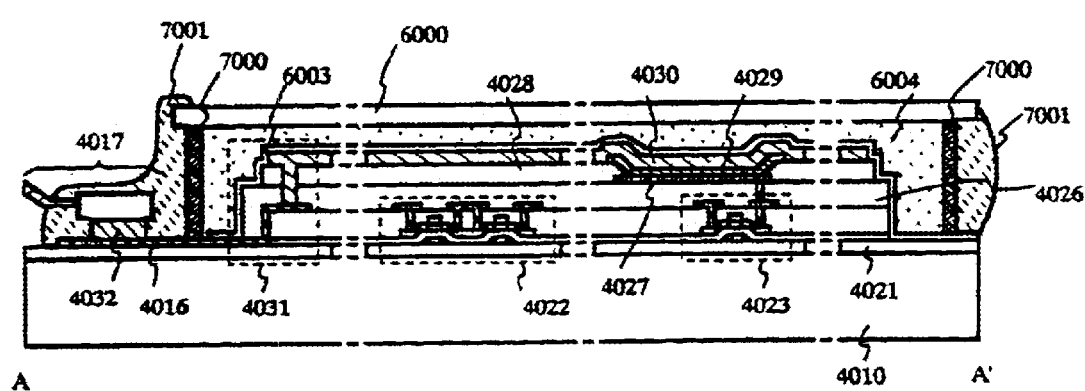

On this occasion, a cover member 6000, a sealing member (also termed "housing member") 7000 (FIG. 13(B)), and a hermetic seal member (second sealing member) 7001 are disposed so as to surround, at least, the pixel unit, and preferably, the driver circuits and the pixel unit.

In addition, FIG. 13(B) illustrates the sectional structure of the EL display panel of this embodiment. TFTs for the driver circuit, 4022 (here, a CMOS circuit in which an n-channel TFT and a p-channel TFT are combined is depicted), and a TFT for the pixel unit, 4023 (here, only the TFT for controlling current toward the EL element is depicted) are formed on a substrate 4010 as well as a base film 4021. Here in the illustrated example, the TFTs are the bottom gate type TFTs based on the fabricating method of Embodiment 4. However, this is not especially restrictive, but the TFTs may have a known structure (top-gate structure or bottom-gate structure).

When the driver circuit TFTs 4022 having active layers made of crystalline semiconductor films and the pixel unit TFT 4023 having an active layer made of an amorphous semiconductor film have been finished up by adopting the present invention, a pixel electrode 4027 which is made of a transparent conductive film and which is electrically connected with the drain of the pixel unit TFT 4023 is formed on an interlayer insulating film (a flattening film) 4026 which is made of a resin material. A compound (called "ITO") of indium oxide and tin oxide, or a compound of indium oxide and zinc oxide can be used for the transparent conductive film. Besides, after the formation of the pixel electrode 4027 serving as an anode, an insulating film 4028 is deposited and is formed with an opening on the pixel electrode 4027.

Subsequently, an EL layer 4029 is formed. The EL layer 4029 may be constructed into a multilayer structure or a single-layer structure by optionally combining known EL materials (a hole injection layer, a hole transport layer, a luminescent layer, an electron transport layer, and an electron injection layer). The structure may be determined by known techniques. Besides, the EL materials are classified into low-molecular materials and high-molecular (polymer) materials. In case of employing the low-molecular material, vapor deposition is relied on, whereas in case of employing the high-molecular material, a simple method such as spin coating, ordinary printing or ink jet printing can be relied on.

In this embodiment, the EL layer is formed in accordance with vapor deposition by employing a shadow mask. Luminescent layers (red luminescent layer, green luminescent layer and blue luminescent layer) capable of luminescences of different wavelengths are formed every pixel by employing the shadow mask, whereby a color display becomes possible. There are also a scheme in which color conversion measures (CCM) and color filters are combined, and a scheme in which a white luminescent layer and color filters are combined, and any of such methods may well be employed. Of course, an EL display panel of monochromatic luminescence can be constructed.

After the EL layer 4029 has been formed, it is overlaid with a cathode 4030. Moisture and oxygen to exist at the boundary between the cathode 4030 and the EL layer 4029 should desirably be excluded to the utmost beforehand. Accordingly, such a contrivance is required that the EL layer 4029 and the cathode 4030 are consecutively formed in vacuum, or that the EL layer 4029 is formed in an inactive atmosphere, followed by forming the cathode 4030 without exposing the resulting substrate to the atmospheric air. In this embodiment, the film formation as explained above is incarnated by employing a film forming equipment of multichamber system (cluster tool system).

By the way, in this embodiment, the multilayer structure consisting of an LiF (lithium fluoride) film and an Al (aluminum) film is employed for the cathode 4030. More concretely, the LiF film being 1 [nm] thick is formed on the EL layer 4029 by vapor deposition, and it is overlaid with the Al film being 300 [nm] thick. It is, of course, allowed to employ an MgAg electrode which is a known cathode member. Besides, the cathode 4030 is connected to the wiring line 4016 in a region which is indicated by numeral 4031. The wiring line 4016 is a supply voltage feed line for applying a predetermined voltage to the cathode 4030, and it is connected to the FPC 4017 through a conductive paste material 4032.

For the purpose of electrically connecting the cathode 4030 and the wiring line 4016 in the region 4031, contact holes need to be formed in the interlayer insulating film 4026 and the insulating film 4028. They may be previously formed at the etching of the interlayer insulating film 4026 (at the formation of the contact hole for the pixel electrode) and at the etching of the insulating film 4028 (at the formation of an opening before the formation of the EL layer). Alternatively, in etching the insulating film 4028, also the interlayer insulating film 4026 may be etched in collective fashion. In this case, if the interlayer insulating film 4026 and the insulating film 4028 are made of the same resin material, the contact holes can be formed into favorable shapes.

A passivation film 6003, a filler member 6004 and the cover member 6000 are formed covering the surface of the EL element thus formed.

Further, the sealing member 7000 is disposed between the cover member 6000 and the substrate 4010 so as to surround the EL element portion, and the hermetic seal member (second sealing member) 7001 is formed outside the sealing member 7000.

On this occasion, the filler member 6004 functions also as an adhesive for bonding the cover member 6000. Usable for the filler member 6004 is PVC (polyvinyl chloride), an epoxy resin, a silicone resin, PVB (polyvinyl butylal) or EVA (ethylene vinyl acetate). When a drying agent is introduced into the filler member 6004 beforehand, favorably a hygroscopic effect can be kept.

Besides, a spacer may well be contained in the filler member 6004. On this occasion, a granular material made of BaO or the like may well be selected as the spacer, thereby to endow the spacer itself with a hygroscopicity.

In the case of disposing the spacer, the passivation film 6003 can relax a spacer pressure. It is also allowed to dispose a resin film or the like relaxing the spacer pressure, separately from the passivation film 6003.

Usable as the cover member 6000 is a glass plate, an aluminum plate, a stainless steel plate, an FRP (Fiberglass-Reinforced Plastics) plate, a PVF (polyvinyl fluoride) film, a Mylar film, a polyester film, or an acrylic film. By the way, in the case of using the substance PVB or EVA for the filler member 6004, it is favorable to employ a sheet having a structure in which an aluminum foil being several tens [μm] thick is sandwiched in between the PVF films or the Mylar films.

Depending upon the direction of luminescence (the radiating direction of light) from the EL element, however, the cover member 6000 needs to have a light transmitting property.

In addition, the wiring line 4016 is electrically connected to the FPC 4017 by passing through the gap between the sealing member 7000 as well as the hermetic seal member 7001 and the substrate 4010. Although the wiring line 4016 has been explained here, the other wiring lines 4014, 4015 are electrically connected to the FPC 4017 by passing under the sealing member 7000 and the hermetic seal member 7001, likewise to the wiring line 4016.

Besides, in this embodiment, the pixel electrode is formed as the anode, and hence, a PTFT should preferably be employed as the current controlling TFT. Regarding the fabricating process, Embodiment 4 may be referred to. In the case of this embodiment, the light generated in the luminescent layer is radiated toward the substrate formed with the TFTs. Alternatively, the current controlling TFT may well be formed of the NTFT according to the present invention. In the case of employing the NTFT as the current controlling TFT, the pixel electrode (the cathode of the EL element) made of a conductive film of high reflectivity may be connected with the drain of the pixel unit TFT 4023, whereupon an EL layer and an anode made of a light-transmitting conductive film may be formed in succession. In this case, the light generated in the luminescent layer is radiated toward the substrate not formed with the TFTs.

Incidentally, this embodiment can be combined with any of Embodiments 1–8 at will.

Embodiment 11

A CMOS circuit or a pixel unit which has been formed by performing the present invention, is applicable to various electrooptic devices (such as an active matrix type liquid crystal display device, an active matrix type EL display device, and an active matrix type EC display device). Accordingly, the present invention can be performed in all electronic equipment in which the electrooptic devices are incorporated as display units.

Mentioned as such electronic equipment are a video camera, a digital camera, a projector (of rear type or front type), a head-mounted type display (goggle type display), a car navigation equipment, a personal computer, a portable information terminal (such as mobile computer, portable telephone set or electronic book), and so forth. Examples of them are illustrated in FIGS. 14(A)–14(F) and FIGS. 15(A)–15(C).

Figure 14A:
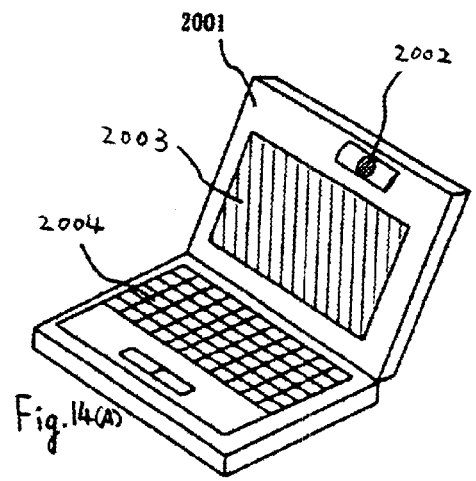
FIGS. 14(A) thru 14(F) are schematic views each showing an example of electronic equipment.

FIG. 14(A) shows a personal computer, which includes the body 2001, an image input unit 2002, a display unit 2003, and a keyboard 2004. The present invention can be applied to the image input unit 2002, the display unit 2003 and other signal controlling circuits.

Figure 14B:
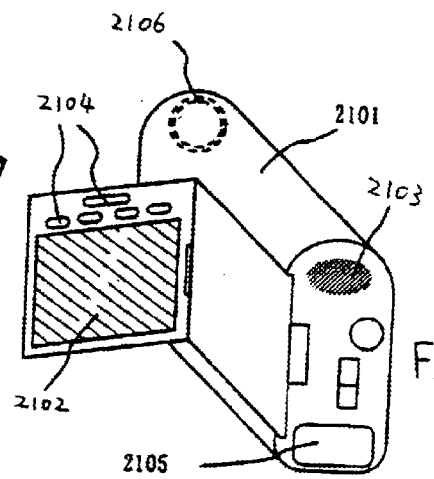

FIG. 14(B) shows a video camera, which includes the body 2101, a display unit 2102, a sound input unit 2103, operating switches 2104, a battery 2105, and an image receiving unit 2106. The present invention can be applied to the display unit 2102 and other signal controlling circuits.

Figure 14C:
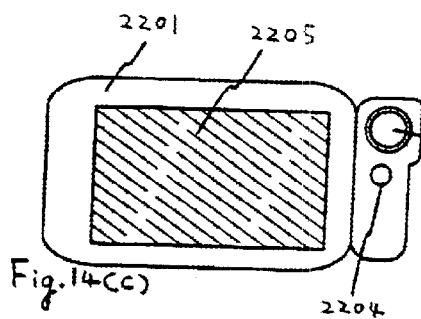

FIG. 14(C) shows a mobile computer, which includes the body 2201, a camera unit 2202, an image receiving unit 2203, an operating switch 2204, and a display unit 2205. The present invention can be applied to the display unit 2205 and other signal controlling circuits.

Figure 14D:
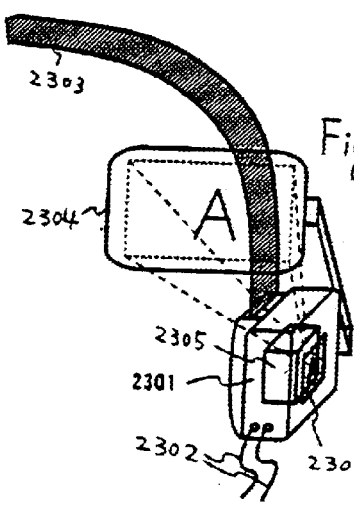

FIG. 14(D) shows a part (the right side) of a head-mounted type EL display, which includes the body 2301, signal cables 2302, a head-fixed band 2303, a display screen 2304, an optical system 2305, and a display device 2306. The present invention can be adopted for the display device 2306.

Figure 14E:
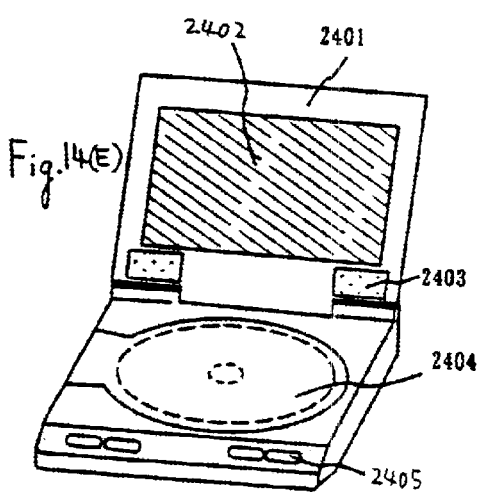

FIG. 14(E) shows a player which is used for a recording medium (2404) storing programs therein, and which includes the body 2401, a display unit 2402, a loudspeaker unit 2403, and operating switches 2405. By the way, the recording medium 2404 is a DVD (Digital Versatile Disc), a CD (Compact Disc), or the like, and the player is capable of reproducing music, a motion picture, a video game or information obtained through the Internet. The present invention can be applied to the display unit 2402 and other signal controlling circuits.

Figure 14F:
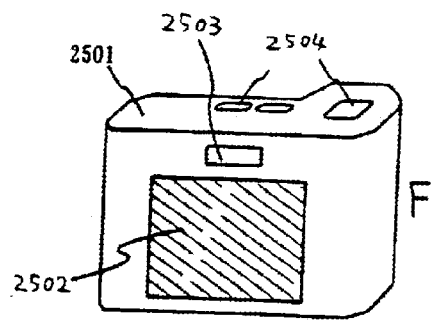

FIG. 14(F) shows a digital camera, which includes the body 2501, a display unit 2502, a view window 2503, operating switches 2504, and an image receiving portion (not shown). The present invention can be applied to the display unit 2502 and other signal controlling circuits.

Figure 15A:
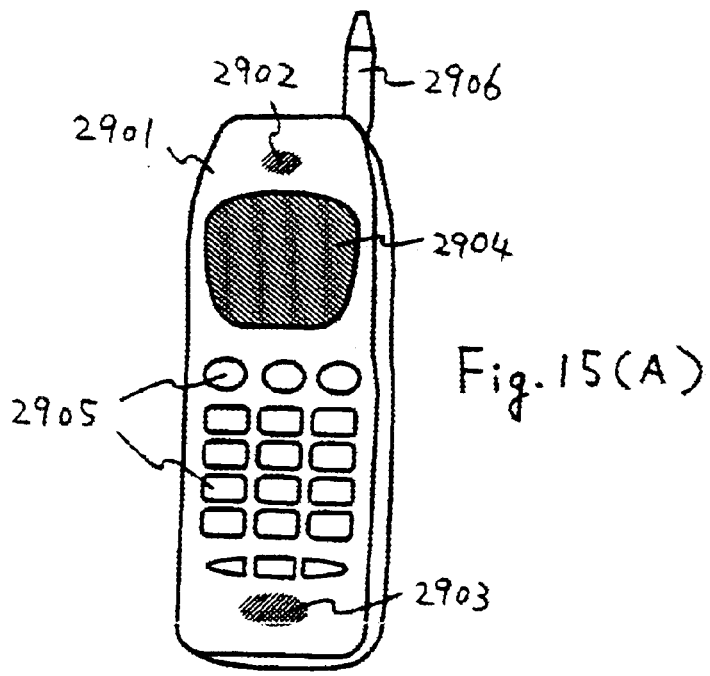
FIGS. 15(A) thru 15(C) are schematic views each showing an example of electronic equipment.

FIG. 15(A) shows a portable telephone set, which includes the body 2901, a voice output unit 2902, a voice input unit 2903, a display unit 2904, operating switches 2905, and an antenna 2906. The present invention can be applied to the voice output unit 2902, the voice input unit 2903, the display unit 2904, and other signal controlling circuits.

Figure 15B:
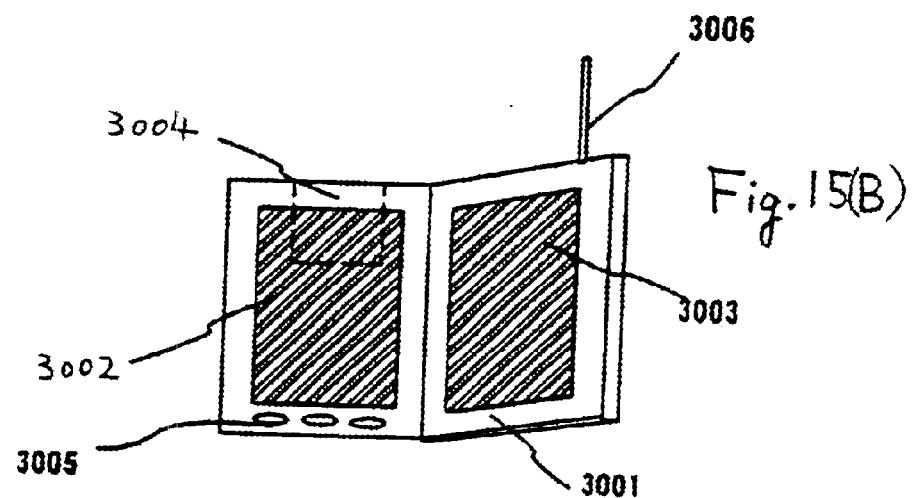

FIG. 15(B) shows a portable book (electronic book), which includes the body 3001, display units 3002, 3003, a storage medium 3004, operating switches 3005, and an antenna 3006. The present invention can be applied to the display units 3002, 3003, and other signal circuits.

Figure 15C:
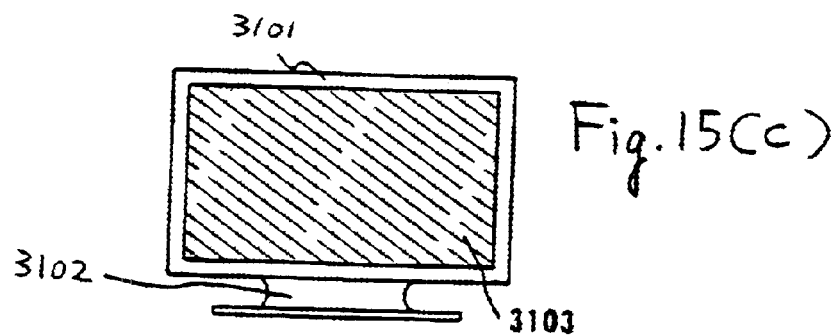

FIG. 15(C) shows a display, which includes the body 3101, a supporter 3102, and a display panel 3103. The present invention can be applied to the display panel 3103. The display according to the present invention is meritorious especially in case of an enlarged panel which is at least 10 [inches] (particularly, at least 30 [inches]) long diagonally.

As described above, the present invention has very wide applications and is applicable to electronic equipment in all fields. Moreover, the electronic equipment of this embodiment can be realized with a construction which is in any combination of Embodiments 1–10.

Owing to the present invention, the respective circuits of an electrooptic device represented by an AM-LCD or an EL display device can be formed of TFTs of appropriate structures in accordance with the functions of the circuits, whereby the electrooptic device having a high reliability can be incarnated.

What is claimed is:

1. A method for forming a semiconductor device comprising:
   forming a semiconductor film over a substrate, said semiconductor film extending in a pixel region and a driver circuit region; and
   irradiating a continuous wave laser light to a part of said semiconductor film in at least said driver circuit region to crystallize said part of said semiconductor film in at least said driver circuit region.

2. A method according to claim 1 wherein an active layer of an N-channel thin film transistor of said driver circuit region is formed in the crystallized part of said semiconductor film.

3. A method according to claim 1 wherein an active layer of a P-channel thin film transistor of said driver circuit region is formed in the crystallized part of said semiconductor film.

4. A method according to claim 2 wherein said active layer comprises a source region, a drain region, a channel region and a lightly doped drain region.

5. A method according to claim 3 wherein said active layer comprises a source region, a drain region, a channel region and a lightly doped drain region.

6. A method according to claim 1 wherein a shift register circuit is formed in said driver circuit region.

7. A method according to claim 1 wherein a level shifter circuit is formed in said driver circuit region.

8. A method according to claim 1 wherein a buffer circuit is formed in said driver circuit region.

9. A method according to claim 1 wherein a sampling circuit is formed in said driver circuit region.

10. A method according to claim 1 wherein said continuous wave laser light is an argon laser light.

11. A method according to claim 1 wherein said semiconductor device is incorporated into one selected from the group consisting of personal computer, video camera, mobile computer, head-mount display, player used for recording medium storing programs, digital camera, portable telephone, portable book, and display.

12. A method for forming a semiconductor device comprising:
   forming a semiconductor film over a substrate, said semiconductor film extending in a pixel region and a driver circuit region; and
   irradiating a continuous wave laser light to a part of said semiconductor film in at least said driver circuit region while moving said substrate relative to said continuous wave laser light to crystallize said part of said semiconductor film in at least said driver circuit region.

13. A method according to claim 12 wherein an active layer of an N-channel thin film transistor of said driver circuit region is formed in the crystallized part of said semiconductor film.

14. A method according to claim 12 wherein an active layer of a P-channel thin film transistor of said driver circuit region is formed in the crystallized part of said semiconductor film.

15. A method according to claim 13 wherein said active layer comprises a source region, a drain region, a channel region and a lightly doped drain region.

16. A method according to claim 14 wherein said active layer comprises a source region, a drain region, a channel region and a lightly doped drain region.

17. A method according to claim 12 wherein a shift register circuit is formed in said driver circuit region.

18. A method according to claim 12 wherein a level shifter circuit is formed in said driver circuit region.

19. A method according to claim 12 wherein a buffer circuit is formed in said driver circuit region.

20. A method according to claim 12 wherein a sampling circuit is formed in said driver circuit region.

21. A method according to claim 12 wherein said continuous wave laser light is an argon laser light.

22. A method according to claim 12 wherein said semiconductor device is incorporated into one selected from the group consisting of personal computer, video camera, mobile computer, head-mount display, player used for recording medium storing programs, digital camera, portable telephone, portable book, and display.

23. A method for forming an electroluminescent display device comprising:
   forming a semiconductor film over a substrate, said semiconductor film extending in a pixel region and a driver circuit region; and
   irradiating a continuous wave laser light to a part of said semiconductor film in at least said driver circuit region to crystallize said part of said semiconductor film in at least said driver circuit region.

24. A method according to claim 23 wherein an active layer of an N-channel thin film transistor of said driver circuit region is formed in the crystallized part of said semiconductor film.

25. A method according to claim 23 wherein an active layer of a P-channel thin film transistor of said driver circuit region is formed in the crystallized part of said semiconductor film.

26. A method according to claim 24 wherein said active layer comprises a source region, a drain region, a channel region and a lightly doped drain region.

27. A method according to claim 25 wherein said active layer comprises a source region, a drain region, a channel region and a lightly doped drain region.

28. A method according to claim 23 wherein a shift register circuit is formed in said driver circuit region.

29. A method according to claim 23 wherein a level shifter circuit is formed in said driver circuit region.

30. A method according to claim 23 wherein a buffer circuit is formed in said driver circuit region.

31. A method according to claim 23 wherein a sampling circuit is formed in said driver circuit region.

32. A method according to claim 23 wherein said continuous wave laser light is an argon laser light.

33. A method according to claim 23 wherein said electroluminescent display device is incorporated into one selected from the group consisting of personal computer, video camera, mobile computer, head-mount display, player used for recording medium storing programs, digital camera, portable telephone, and portable book.

34. A method for forming a semiconductor device comprising:
   forming a semiconductor film over a substrate, said semiconductor film extending in a pixel region and a driver circuit region; and
   irradiating a continuous wave laser light to a part said semiconductor film in at least said driver circuit region while moving said substrate relative to said continuous wave laser light to crystallize said part of said semiconductor film in at least said driver circuit region by using a galvanometer.

35. A method according to claim 34 wherein an active layer of an N-channel thin film transistor of said driver circuit region is formed in the crystallized part of said semiconductor film.

36. A method according to claim 34 wherein an active layer of a P-channel thin film transistor of said driver circuit region is formed in the crystallized par of said semiconductor film.

37. A method according to claim 35 wherein said active layer comprises a source region, a drain region, a channel region and a lightly doped drain region.

38. A method according to claim 36 wherein said active layer comprises a source region, a drain region, a channel region and a lightly doped drain region.

39. A method according to claim 34 wherein a shift register circuit is formed in said driver circuit region.

40. A method according to claim 34 wherein a level shifter circuit is formed in said driver circuit region.

41. A method according to claim 34 wherein a buffer circuit is formed in said driver circuit region.

42. A method according to claim 34 wherein a circuit is formed in said driver circuit region.

43. A method according to claim 34 wherein said continuous wave laser light is an argon laser light.

44. A method for forming a semiconductor device comprising;
   forming a semiconductor film over a substrate, said semiconductor film extending in a pixel region and a driver circuit region; and
   irradiating a continuous wave laser light to a part of said semiconductor film in at least said driver circuit region to crystallize said part of said semiconductor film in at least said driver circuit region while a part of the semiconductor film in said pixel region is not irradiated with said continuous laser light.

45. A method according to claim 44 wherein an active layer of an N-channel thin film transistor of said driver circuit region is formed in the crystallized part of said semiconductor film.

46. A method according to claim 44 wherein an active layer of a P-channel thin film transistor of said driver circuit region is formed in the crystallized part of said semiconductor film.

47. A method according to claim 45 wherein said active layer comprises a source region, a drain region, a channel region and a lightly doped drain region.

48. A method according to claim 46 wherein said active layer comprises a source region, a drain region, a channel region and a lightly doped drain region.

49. A method according to claim 44 wherein a shift register circuit is formed in said driver circuit region.

50. A method according to claim 44 wherein a level shifter circuit is formed in said driver circuit region.

51. A method according to claim 44 wherein a buffer circuit is formed in said driver circuit region.

52. A method according to claim 44 wherein a sampling circuit is formed in said driver circuit region.

53. A method according to claim 44 wherein said continuous wave laser light is an argon laser light.

54. A method according to claim 44 wherein said semiconductor device is incorporated into one selected from the group consisting of personal computer, video camera, mobile computer, head-mount display, player used for recording medium storing programs, digital camera, portable telephone, portable book, and display.

55. A method for forming a semiconductor device comprising:
   forming a semiconductor film over a substrate, said semiconductor film extending in a pixel region and a driver circuit region; and
   irradiating a continuous wave laser light to a part of said semiconductor film in at least said driver circuit region while moving said substrate relative to said continuous wave laser light to crystallize said part of said semiconductor film in at least said driver circuit region, while a part of the semiconductor film in said pixel region is not irradiated with said continuous laser light.

56. A method according to claim 55 wherein an active layer of an N-channel thin film transistor of said driver circuit region is formed in the crystallized part of said semiconductor film.

57. A method according to claim 55 wherein an active layer of a P-channel thin film transistor of said driver circuit region is formed in the crystallized part of said semiconductor film.

58. A method according to claim 56 wherein said active layer comprises a source region, a drain region, a channel region and a lightly doped drain region.

59. A method according to claim 57 wherein said active layer comprises a source region, a drain region, a channel region and a lightly doped drain region.

60. A method according to claim 55 wherein a shift register circuit is formed in said driver circuit region.

61. A method according to claim 55 wherein a level shifter circuit is formed in said driver circuit region.

62. A method according to claim 55 wherein a buffer circuit is formed in said driver circuit region.

63. A method according to claim 55 wherein a sampling circuit is formed in said driver circuit region.

64. A method according to claim 55 wherein said continuous wave laser light is an argon laser light.

65. A method according to claim 55 wherein said semiconductor device is incorporated into one selected from the group consisting of personal computer, video camera, mobile computer, head-mount display, player used for recording medium storing programs, digital camera, portable telephone, portable book, and display.

66. A method for forming an electroluminescent display device comprising:
   forming a semiconductor film over a substrate, said semiconductor film extending in a pixel region and a driver circuit region; and irradiating a continuous wave laser light to a part of said semiconductor film in at least said driver circuit region to crystallize said part of said semiconductor film in at least said driver circuit region while a part of the semiconductor film in said pixel region is not irradiated with said continuous laser light.

67. A method according to claim 66 wherein an active layer of an N-channel thin film transistor of said driver circuit region is formed in the crystallized part of said semiconductor film.

68. A method according to claim 66 wherein an active layer of a P-channel thin film transistor of said driver circuit region is formed in the crystallized part of said semiconductor film.

69. A method according to claim 67 wherein said active layer comprises a source region, a drain region, a channel region and a lightly doped drain region.

70. A method according to claim 68 wherein said active layer comprises a source region, a drain region, a channel region and a lightly doped drain region.

71. A method according to claim 66 wherein a shift register circuit is formed in said driver circuit region.

72. A method according to claim 66 wherein a level shifter circuit is formed in said driver circuit region.

73. A method according to claim 66 wherein a buffer circuit is formed in said driver circuit region.

74. A method according to claim 66 wherein a sampling circuit is formed in said driver circuit region.

75. A method according to claim 66 wherein said continuous wave laser light is an argon laser light.

76. A method according to claim 66 wherein said electroluminescent display device is incorporated into one selected from the group consisting of personal computer, video camera, mobile computer, head-mount display, player used for recording medium storing programs, digital camera, portable telephone, and portable book.

77. A method for forming a semiconductor device comprising:

forming a semiconductor film over a substrate, said semiconductor film extending in a pixel region and a driver circuit region; and irradiating a continuous wave laser light to a part said semiconductor film in at least said driver circuit region while moving said substrate relative to said continuous wave laser light to crystallize said part of said semiconductor film in at least said driver circuit region while a part of the semiconductor film in said pixel is not irradiated with said continuous laser light by using a galvanometer.

78. A method according to claim 77 wherein an active layer of an N-channel thin film transistor of said driver circuit region is formed in the crystallized part of said semiconductor film.

79. A method according to claim 77 wherein an active layer of a P-channel thin film transistor of said driver circuit region is formed in the crystallized par of said semiconductor film.

80. A method according to claim 78 wherein said active layer comprises a source region, a drain region, a channel region and a lightly doped drain region.

81. A method according to claim 79 wherein said active layer comprises a source region, a drain region, a channel region and a lightly doped drain region.

82. A method according to claim 77 wherein a shift register circuit is formed in said driver circuit region.

83. A method according to claim 77 wherein a level shifter circuit is formed in said driver circuit region.

84. A method according to claim 77 wherein a buffer circuit is formed in said driver circuit region.

85. A method according to claim 77 wherein a sampling circuit is formed in said driver circuit region.

86. A method according to claim 77 wherein said continuous wave laser light is an argon laser light.

* * * * *